(12) United States Patent
Yamazaki et al.

(10) Patent No.: US 10,032,840 B2
(45) Date of Patent: *Jul. 24, 2018

(54) LIGHT-EMITTING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Mai Osada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/345,677

(22) Filed: Nov. 8, 2016

(65) Prior Publication Data

US 2017/0154940 A1 Jun. 1, 2017

Related U.S. Application Data

(60) Continuation of application No. 15/132,332, filed on Apr. 19, 2016, now Pat. No. 9,502,483, which is a
(Continued)

(30) Foreign Application Priority Data

Feb. 29, 2000 (JP) ................ 2000-054963

(51) Int. Cl.
*H01L 27/32* (2006.01)
*H01L 29/786* (2006.01)
(Continued)

(52) U.S. Cl.
CPC ...... *H01L 27/3262* (2013.01); *H01L 27/3211* (2013.01); *G09G 3/3233* (2013.01);
(Continued)

(58) Field of Classification Search
CPC ............. H01L 27/101; H01L 29/41733; H01L 29/78696; H01L 27/3265; G09G 3/3233
See application file for complete search history.

(56) References Cited

U.S. PATENT DOCUMENTS 3,909,788 A   9/1975 Kaelin et al.
4,810,060 A   3/1989 Ukai
(Continued)

FOREIGN PATENT DOCUMENTS

EP   0776147 A   5/1997
EP   0845770 A   6/1998
(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.
(Continued)

*Primary Examiner* — Abbas I Abdulselam
(74) *Attorney, Agent, or Firm* — Fish & Richardson P.C.

(57) ABSTRACT

There is provided a semiconductor device including a first pixel and a second pixel each including a transistor and an EL element including a pixel electrode electrically connected to the transistor. A ratio of a channel width (W) to a channel length (L) of the transistor in the first pixel is different from a ratio of a channel width (W) to a channel length (L) of the transistor in the second pixel.

53 Claims, 20 Drawing Sheets

Related U.S. Application Data continuation of application No. 14/924,793, filed on Oct. 28, 2015, now Pat. No. 9,331,130, which is a continuation of application No. 14/710,659, filed on May 13, 2015, now Pat. No. 9,178,004, which is a continuation of application No. 14/198,756, filed on Mar. 6, 2014, now Pat. No. 9,035,853, which is a continuation of application No. 13/946,002, filed on Jul. 19, 2013, now Pat. No. 8,674,909, which is a continuation of application No. 13/010,118, filed on Jan. 20, 2011, now Pat. No. 8,493,295, which is a continuation of application No. 11/553,197, filed on Oct. 26, 2006, now Pat. No. 7,995,010, which is a continuation of application No. 10/600,866, filed on Jun. 23, 2003, now Pat. No. 7,129,917, which is a division of application No. 09/796,412, filed on Feb. 27, 2001, now Pat. No. 6,583,776.

(51) Int. Cl.
| | | |
|---|---|---|
| H01L 27/12 | (2006.01) | |
| G09G 3/3233 | (2016.01) | |
| G09G 3/3275 | (2016.01) | |
| G09G 3/3266 | (2016.01) | |

(52) U.S. Cl.
CPC ......... *G09G 3/3266* (2013.01); *G09G 3/3275* (2013.01); *G09G 2300/0417* (2013.01); *G09G 2300/0426* (2013.01); *G09G 2300/0814* (2013.01); *G09G 2300/0842* (2013.01); *G09G 2320/0233* (2013.01); *G09G 2320/043* (2013.01); *H01L 27/1222* (2013.01); *H01L 27/1251* (2013.01); *H01L 29/78621* (2013.01); *H01L 29/78654* (2013.01); *H01L 29/78696* (2013.01); *H01L 2227/323* (2013.01)

(56) References Cited

U.S. PATENT DOCUMENTS

| | | | |
|---|---|---|---|
| 5,059,148 A | 10/1991 | Mckenna et al. | |
| 5,247,190 A | 9/1993 | Friend et al. | |
| 5,399,502 A | 3/1995 | Friend et al. | |
| 5,598,021 A | 1/1997 | O.S et al. | |
| 5,641,991 A | 6/1997 | Sakoh | |
| 5,643,826 A | 7/1997 | Ohtani et al. | |
| 5,652,600 A | 7/1997 | Khormaei et al. | |
| 5,684,365 A | 11/1997 | Tang et al. | |
| 5,724,107 A * | 3/1998 | Nishikawa | G02F 1/136213 349/110 |
| 5,764,206 A | 6/1998 | Koyama et al. | |
| 5,798,745 A | 8/1998 | Steffensmeier | |
| 5,807,627 A | 9/1998 | Friend et al. | |
| 5,812,105 A | 9/1998 | Van De Ven | |
| 5,818,068 A | 10/1998 | Sasaki et al. | |
| 5,882,761 A | 3/1999 | Kawami et al. | |
| 5,888,858 A | 3/1999 | Yamazaki et al. | |
| 5,923,962 A | 7/1999 | Ohtani et al. | |
| 5,990,629 A | 11/1999 | Yamada et al. | |
| 6,011,529 A | 1/2000 | Ikeda | |
| 6,019,796 A | 2/2000 | Mei et al. | |
| 6,020,223 A | 2/2000 | Mei et al. | |
| 6,057,647 A | 5/2000 | Kurosawa et al. | |
| 6,072,272 A | 6/2000 | Rumbaugh | |
| 6,107,641 A | 8/2000 | Mei et al. | |
| 6,121,726 A | 9/2000 | Codama et al. | |
| 6,147,667 A | 11/2000 | Yamazaki et al. | |
| 6,165,824 A | 12/2000 | Takano et al. | |
| 6,191,764 B1 | 2/2001 | Kono et al. | |
| 6,204,610 B1 | 3/2001 | Komiya | |
| 6,229,508 B1 | 5/2001 | Kane | |
| 6,246,070 B1 | 6/2001 | Yamazaki et al. | |
| 6,252,248 B1 | 6/2001 | Sano et al. | |
| 6,255,705 B1 | 7/2001 | Zhang et al. | |
| 6,259,138 B1 | 7/2001 | Ohtani et al. | |
| 6,259,838 B1 | 7/2001 | Singh et al. | |
| 6,313,481 B1 | 11/2001 | Ohtani et al. | |
| 6,348,702 B1 * | 2/2002 | Takayama | H01L 27/3262 257/66 |
| 6,380,007 B1 | 4/2002 | Koyama | |
| 6,384,804 B1 | 5/2002 | Dodabalapur et al. | |
| 6,476,784 B2 * | 11/2002 | Zavracky | G06F 1/1626 345/169 |
| 6,479,333 B1 | 11/2002 | Takano et al. | |
| 6,501,227 B1 | 12/2002 | Koyama | |
| 6,583,776 B2 | 6/2003 | Yamazaki et al. | |
| 6,618,030 B2 | 9/2003 | Kane et al. | |
| 6,628,363 B1 | 9/2003 | Sano et al. | |
| 6,700,330 B2 | 3/2004 | Koyama | |
| 6,777,716 B1 * | 8/2004 | Yamazaki | H01L 27/1214 257/88 |
| 6,833,560 B2 | 12/2004 | Konuma et al. | |
| 7,091,936 B1 | 8/2006 | Yamada | |
| 7,132,693 B2 | 11/2006 | Konuma et al. | |
| 7,701,523 B2 | 4/2010 | Hiroki et al. | |
| 7,732,824 B2 | 6/2010 | Konuma et al. | |
| 7,863,622 B2 | 1/2011 | Yamazaki et al. | |
| 7,995,010 B2 * | 8/2011 | Yamazaki | G09G 3/3233 34/82 |
| 8,158,992 B2 | 4/2012 | Konuma et al. | |
| 8,243,233 B2 | 8/2012 | Konuma et al. | |
| 8,735,898 B2 | 5/2014 | Konuma et al. | |
| 2014/0252337 A1 | 9/2014 | Konuma et al. | |

FOREIGN PATENT DOCUMENTS

| | | |
|---|---|---|
| EP | 0883191 A | 12/1998 |
| EP | 0902481 A | 3/1999 |
| EP | 0905673 A | 3/1999 |
| EP | 0913860 A | 5/1999 |
| EP | 1031873 A | 8/2000 |
| EP | 1033765 A | 9/2000 |
| EP | 1087366 A | 3/2001 |
| EP | 1713054 A | 10/2006 |
| JP | 03-153219 A | 7/1991 |
| JP | 05-074569 A | 3/1993 |
| JP | 07-130652 A | 5/1995 |
| JP | 07-294961 A | 11/1995 |
| JP | 08-078329 A | 3/1996 |
| JP | 08-213625 A | 8/1996 |
| JP | 09-016123 A | 1/1997 |
| JP | 09-082970 A | 3/1997 |
| JP | 10-039791 A | 2/1998 |
| JP | 10-092576 A | 4/1998 |
| JP | 10-092745 A | 4/1998 |
| JP | 10-161563 A | 6/1998 |
| JP | 10-312173 A | 11/1998 |
| JP | 11-135802 A | 5/1999 |
| JP | 11-219146 A | 8/1999 |
| JP | 11-354801 A | 12/1999 |
| JP | 2000-208777 A | 7/2000 |
| JP | 2001-109399 A | 4/2001 |
| JP | 2001-159878 A | 6/2001 |
| WO | WO-1990/013148 | 11/1990 |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Dawson.R et al., "4.2:Design of an Improved Pixel for a Polysilicon Active-Matrix Organic LED Display", SID Digest '98 : SID International Symposium Digest of Technical Papers, May 17, 1998, vol. 29, pp. 11-14.

Schenk.H et al., "Polymers for Light Emitting Diodes", Eurodisplay '99 : The 19th International Display Research Conference, Sep. 6, 1999, pp. 33-37.

Tsutsui.T et al., "Electroluminescence in Organic Thin Films", Photochemical Processes in Organized Molecular Systems, 1991, pp. 437-450.

(56) References Cited

OTHER PUBLICATIONS

Tsutsui.T et al., "High Quantum Efficiency in Organic Light-Emitting Devices With Iridium-Complex as a Triplet Emissive Center", Jpn. J. Appl. Phys. (Japanese Journal of Applied Physics), Dec. 15, 1999, vol. 38, No. 12B, pp. L1502-L1504.
Japanese Office Action (Application No. 2001-050583) dated Jan. 25, 2011.
Pending Claims (Serial No. 2001-050583) Dated Jan. 25, 2011.

* cited by examiner

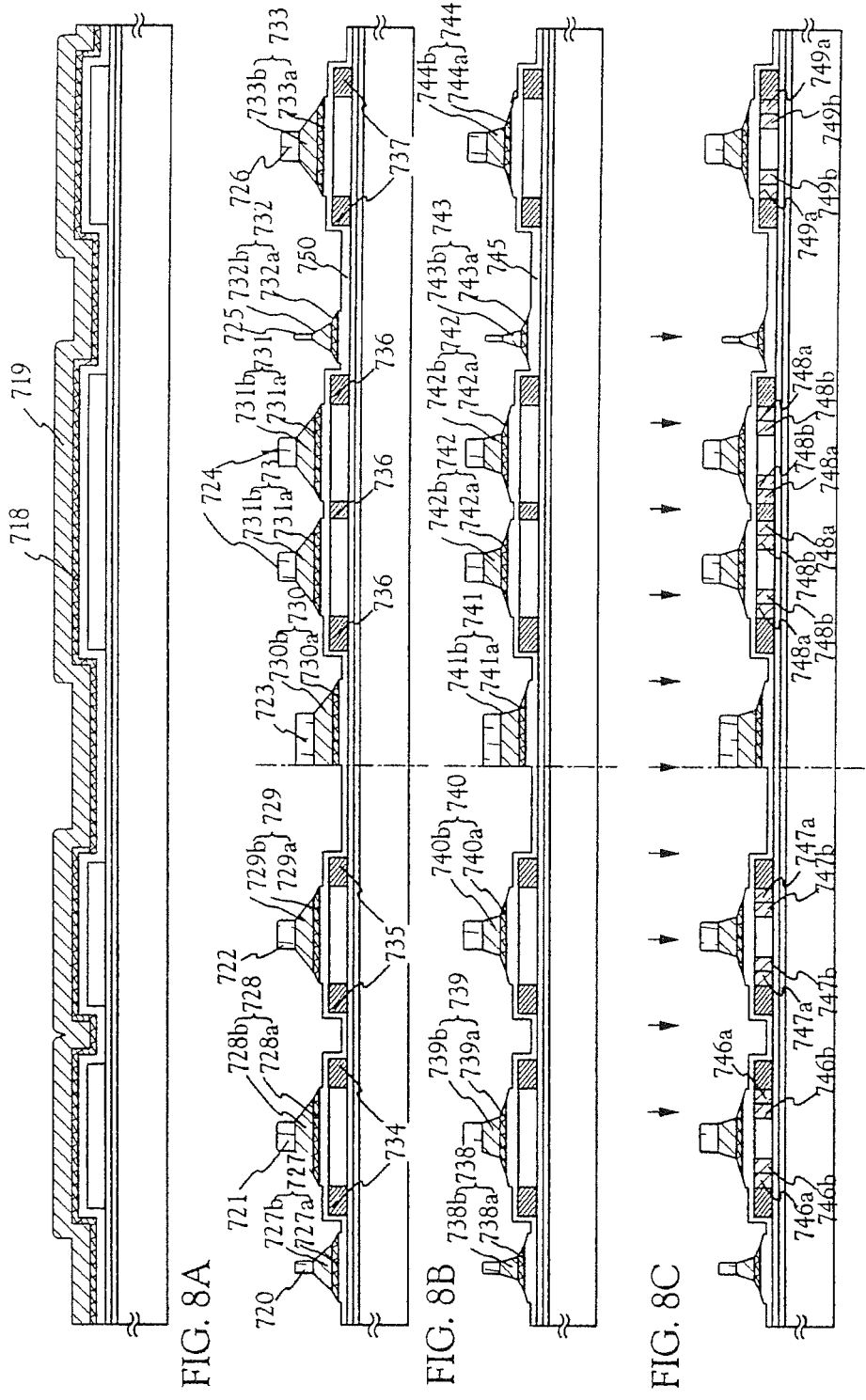

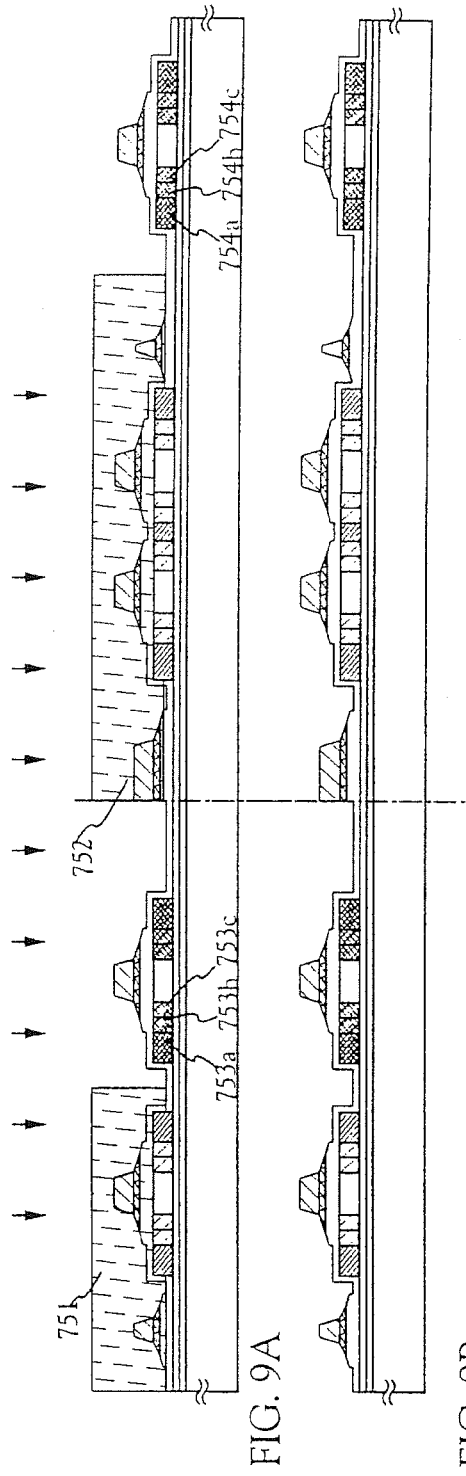
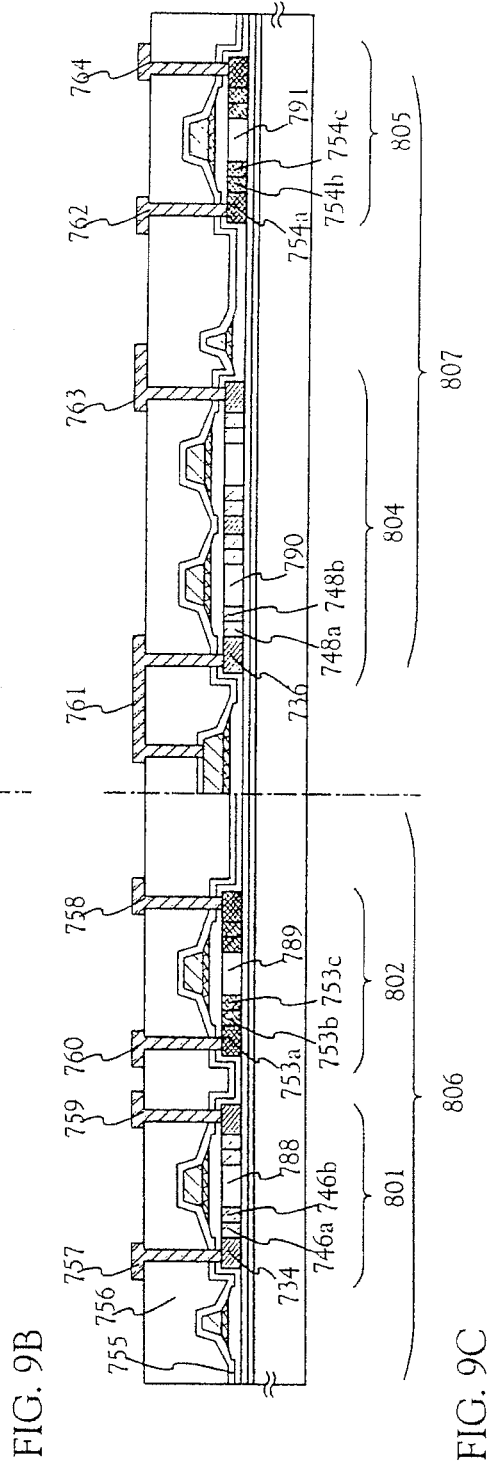
FIG. 9A
FIG. 9B
FIG. 9C

LIGHT-EMITTING DEVICE

CROSS-REFERENCE TO RELATED APPLICATIONS

This application is a continuation of U.S. application Ser. No. 15/132,332, filed Apr. 19, 2016, now allowed, which is a continuation of U.S. application Ser. No. 14/924,793, filed Oct. 28, 2015, now U.S. Pat. No. 9,331,130, which is a continuation of U.S. application Ser. No. 14/710,659, filed May 13, 2015, now U.S. Pat. No. 9,178,004, which is a continuation of U.S. application Ser. No. 14/198,756, filed Mar. 6, 2014, now U.S. Pat. No. 9,035,853, which is a continuation of U.S. application Ser. No. 13/946,002, filed Jul. 19, 2013, now U.S. Pat. No. 8,674,909, which is a continuation of U.S. application Ser. No. 13/010,118, filed Jan. 20, 2011, now U.S. Pat. No. 8,493,295, which is a continuation of U.S. application Ser. No. 11/553,197, filed Oct. 26, 2006, now U.S. Pat. No. 7,995,010, which is a continuation of U.S. application Ser. No. 10/600,866, filed Jun. 23, 2003, now U.S. Pat. No. 7,129,917, which is a divisional of U.S. application Ser. No. 09/796,412, filed Feb. 27, 2001, now U.S. Pat. No. 6,583,776, which claims the benefit of a foreign priority application filed in Japan as Serial No. 2000-054963 on Feb. 29, 2000, all of which are incorporated by reference.

BACKGROUND OF THE INVENTION

1. Field of the Invention

The present invention relates to an EL panel in which an EL element formed on a substrate is sealed between the substrate and a cover member. Further, the present invention relates to an EL module in which an IC is mounted in the EL panel. Incidentally, in the present specification, the EL panel and the EL module are generally referred to as a light-emitting device. The present invention further relates to an electronic instrument using the light-emitting device.

2. Description of the Related Art

In recent years, a technique for forming a TFT on a substrate has been greatly advanced, and application to an active matrix display device has been advanced. Especially, since a TFT using a polysilicon film has an electron field-effect mobility (also called mobility) higher than that of a TFT using a conventional amorphous silicon film, a high speed operation is possible. Thus, control of a pixel, which is conventionally performed by a driving circuit outside a substrate, can be performed by a driving circuit formed on the same substrate as the pixel.

In this sort of active matrix display device, various merits, such as reduction of manufacturing costs, miniaturization of an electro-optic device, improvement of a yield, and reduction of a throughput, can be obtained by forming various circuits and elements on the same substrate.

Further, research of an active matrix type light-emitting device including an EL element as a self-luminous element has been actively carried out. The light-emitting device (EL display) including the EL element is also called an organic EL display (OELD: Organic EL Display) or an organic light-emitting diode (OLED: Organic Light-emitting Diode).

The light-emitting device is of a self-luminous type differently from a liquid crystal display device. The EL element has such a structure that a layer (hereinafter referred to as an EL layer) containing an organic compound is sandwiched between a pair of electrodes (anode and cathode), and the EL layer has normally a laminate structure. Typically, there is cited a laminate structure "hole transporting layer/light-emitting layer/electron transporting layer" proposed by Tang et al. of Eastman Kodak Company. This structure has a very high luminous efficiency, and most of the light-emitting devices on which research and development has been made at present adopt this structure.

In the EL element, luminescence (Electro Luminescence) generated by application of an electric field is obtained, and it includes an anode layer, an EL layer, and a cathode layer. Luminescence in an organic compound includes light emission (fluorescence) generated when a single excited state returns to a ground state and light emission (phosphorescence) generated when a triplet excited state returns to the ground state, and the EL display of the present invention may use either light emission.

In addition, there may be also adopted a structure in which laminating is made on an anode in the order of a hole injecting layer/a hole transporting layer/a light-emitting layer/an electron transporting layer or a hole injecting layer/a hole transporting layer/a light-emitting layer/an electron transporting layer/an electron injecting layer. The light-emitting layer may be doped with a fluorescent pigment or the like.

In the present specification, all layers provided between a cathode and an anode are generally referred to as an EL layer. Thus, all of the foregoing hole injecting layer, hole transporting layer, light-emitting layer, electron transporting layer, electron injecting layer, and the like are included in the EL layer.

Besides, in the present specification, an element formed of an anode, an EL layer and a cathode is referred to as an EL element.

In a light-emitting device, a plurality of pixels are provided in a matrix form, and each of the plurality of pixels includes a thin film transistor (TFT) and an EL element. FIG. 4 is a circuit diagram of a pixel of a general light-emitting device. A pixel 400 includes a switching TFT 401, a current controlling TFT 402, an EL element 403, a source signal line 404, a gate signal line 405, a power supply line 406, and a capacitor 407.

A gate electrode of the switching TFT 401 is connected to the gate signal line 405. One of a source region and a drain region of the switching TFT 401 is connected to the source signal line, and the other is connected to a gate electrode of the current controlling TFT 402. A source region of the current controlling TFT 402 is connected to the power supply line 406, and a drain region is connected to an anode or a cathode of the EL element 403.

In the case where the anode of the EL element 403 is connected to the drain region of the current controlling TFT 402, the anode of the EL element 403 becomes a pixel electrode, and the cathode becomes a counter electrode. On the contrary, in the case where the cathode of the EL element 403 is connected to the drain region of the current controlling TFT 402, the anode of the EL element 403 becomes the counter electrode, and the cathode becomes the pixel electrode.

Note that, in the present specification, a potential difference between a potential of a pixel electrode and a potential of a counter electrode is called an EL driving voltage, and this EL driving voltage is applied to the EL layer.

Note that, as shown in FIG. 4, the capacitor 407 is provided to be connected to the current controlling TFT 402 and the power supply line 406.

The potential (power source potential) of the power supply line 406 is kept constant. The potential of the counter electrode of the EL element 403 is also kept constant. The potential of the counter electrode has a potential difference from the power source potential to such a degree that the EL element emits light when the power source potential is applied to the pixel electrode of the EL element.

The switching TFT 401 comes to have an on state by a selection signal inputted to the gate signal line 405. Incidentally, in the present specification, that a TFT comes to have an on state means that a drain current of the TFT comes to have a state of more than 0.

When the switching TFT 401 comes to have the on state, a video signal inputted from the source signal line 404 is inputted to the gate electrode of the current controlling TFT 402 through the switching TFT 401. Incidentally, in the present specification, the video signal means an analog signal including image information. Incidentally, that a signal is inputted to the gate electrode of the current controlling TFT 402 through the switching TFT 401 means that a carrier moves through an active layer of the switching TFT 401, and a potential of a video signal is given to the gate electrode of the current controlling TFT 402.

The amount of current flowing through the channel formation region of the current controlling TFT 402 is controlled by a gate voltage Vgs of a potential difference between the gate electrode and the source region of the current controlling TFT 402. Thus, the potential given to the pixel electrode of the EL element 403 is determined by the height of the potential of the video signal inputted to the gate electrode of the current controlling TFT 402. The emission luminance of the EL element (luminance of light emitted from the EL element) is controlled by the height of the potential given to the pixel electrode. That is, the luminance of the EL element 403 is controlled by the potential of the video signal inputted to the source signal line 404 and a gradation display is carried out.

FIG. 5 shows the relation between the emission luminance (cd/m$^2$) of an EL element and the current density (mA/cm$^2$). The relation between the emission luminance of the EL element and the current density is linear. That is, when the current density of the EL element becomes high at a constant rate, the emission luminance of the EL element also becomes high at a constant rate. The current density is determined by a drain current Id of the current controlling TFT 402.

Although it is desirable that TFTs formed in a pixel portion of a light-emitting device have the same characteristics, actually, the characteristics of the respective TFTs are subtly different from one another. Particularly, threshold Vth of a TFT is influenced by a difference in crystallinity of an active layer, an impurity unintentionally mixed in the active layer, and the like. Thus, there has been a case where Vth is different among the TFTs. Incidentally, in the present specification, the active layer means a semiconductor film including a source region, a drain region, and a channel forming region of a TFT.

When the value of the threshold Vth of the TFT becomes different, the value of the drain current Id also becomes different. Expression 1 indicates the relation between the drain current Id and the threshold Vth.

$$Id = \frac{1}{2} * \mu * C_0 * \frac{W}{L} * (Vgs - Vth)^2 \qquad \text{[Expression 1]}$$

Where, μ (m$^2$/V·sec) indicates a mobility of the TFT, and Co(F/cm$^2$) indicates a capacitance value per unit area of a capacitance (gate capacitance) formed by a gate electrode, an active layer and a gate insulating film of the TFT.

Besides, W and L indicate a channel width and a channel length of a channel forming region of the TFT, respectively, and its position is shown in FIG. 6. FIG. 6 is a view schematically showing the TFT, and the active layer includes a channel forming region 601, a source region 602, and a drain region 603. The channel forming region 601 is provided to be sandwiched between the source region 602 and the drain region 603. Although not shown in FIG. 6, there is also a case where an LDD region is provided between the channel forming region 601 and the source region 602 or the drain region 603.

A gate electrode 604 is provided over the channel forming region 601 through a gate insulating film (not shown). Note that in the present specification, the channel forming region 601 is included in a portion of an active layer 600 overlapping with the gate electrode 604 and indicates a portion where a channel is actually formed when a voltage is applied to the gate electrode 604.

The channel length L is a length of the channel forming region in the direction in which a carrier of a free electron or free hole flows. The channel width W is a length of the channel forming region in the direction vertical to the direction in which the carrier flows. Although the TFT shown in FIG. 6 has a single gate structure, in the case of a TFT having a multigate structure such as a double gate structure or a triple gate structure, the channel length L is defined as the sum of lengths of channel forming regions formed under all gate electrodes in the direction in which the carrier flows.

As indicated by the expression 1, when the value of the threshold voltage Vth is varied, the value of the drain current Id is also varied. Thus, if the value of the threshold voltage Vth of the current controlling TFT is different among pixels, even if video signals having the same potential are inputted to the respective pixels, the emission luminance of the EL element becomes different among the pixels. Note that in the present specification, to input a signal to a pixel means to input a signal to a gate electrode of a current controlling TFT through a switching TFT included in the pixel.

If the emission luminance is not uniform in all pixels of the light-emitting device, unevenness of luminance (uneven luminance) appears in an image displayed on the pixel portion and is visually recognized by an observer.

In order to suppress the foregoing uneven luminance, as shown in FIG. 18, a light-emitting device having a structure in which four TFTs are provided in a pixel is devised (SID'98 DIGEST 4.2 "Design of an Improved Pixel for a Polysilicon Active-Matrix Organic LED Display" R. M. A. Dawson etc.).

In FIG. 18, reference numeral 1701 designates a first thin film transistor; 1702, a second thin film transistor; 1703, a third thin film transistor; and 1704, a fourth thin film transistor. The emission luminance of an EL element 1705 is controlled by the first to fourth four thin film transistors.

When the first thin film transistor 1701 comes to have the on state by a selection signal inputted to a gate signal line (G), and the third thin film transistor 1703 comes to have the on state by a signal inputted to a first signal line (AZ), a gate electrode and a drain region of the second thin film transistor 1702 are short-circuited. Since the fourth thin film transistor 1704 is in an off state by a signal inputted to a second signal line (AZB), a gate voltage Vgs of a voltage between the gate electrode and a source region of the second thin film transistor 1702 enters into a subthreshold region determined by a leak current.

Next, the third thin film transistor 1703 comes to have the off state by a signal inputted to the first signal line (AZ). Then, a video signal is inputted to a source signal line (S) and a potential of the video signal is given to the gate electrode of the second thin film transistor 1702 through the first thin film transistor 1701 having the on state. Accordingly, the gate voltage Vgs of the third thin film transistor 1703 becomes a potential obtained by adding the potential of the video signal to the gate voltage Vgs having entered into the subthreshold region.

Next, the first thin film transistor 1701 comes to have the off state by a selection signal inputted to the gate signal line (G). Then, the fourth thin film transistor 1704 comes to have the on state by a signal inputted to the second signal line (AZB). Since a current flowing through the channel forming region of the TFT depends on the value of the gate voltage Vgs of the third thin film transistor 1703, the current having the intensity corresponding to the potential of the video signal is inputted to a pixel electrode of the EL element 1705.

In the case of the light-emitting device having the above structure, in the case where video signals having the same potential are inputted to the source signal line, it is possible to prevent the potential given to the pixel electrode from being varied by the value of the threshold Vth of the second thin film transistor 1702. Thus, the uneven luminance of an image can be suppressed. However, if the number of thin film transistors provided in each pixel is increased, the opening ratio is lowered, and it becomes necessary to increase a current flowing through an EL element in order to obtain constant luminance. If the current flowing through the EL element is increased, deterioration of the EL layer is accelerated, which is not preferable.

Besides, if the number of TFTs provided in a pixel is increased, there is a fear that yield of the light-emitting device itself is lowered.

SUMMARY OF THE INVENTION

In view of the above, the present invention has an object to provide a light-emitting device in which the number of thin film transistors provided in each of pixels is restricted to two, and uneven luminance due to fluctuation in threshold voltage of current controlling TFTs included in the respective pixels can be suppressed.

The present inventors have considered that it is necessary to restrict a difference in emission luminance of respective pixels provided in a pixel portion to a certain constant range (for example, within ±5%) in order to prevent uneven luminance of an image from being visually recognized by an observer. Further, since uneven luminance is more noticeable between adjacent pixels, the present inventor et al. have considered that it is necessary that the difference in emission luminance between adjacent pixels is restricted to a range (for example, within ±3%) narrower than the difference of emission luminance between pixels which are not adjacent to each other.

For example, in order to restrict the difference in the emission luminance of the respective pixels to a range of ±n %, the following expression can be derived from the expression 1. When the expression 1 is modified, expression 2 is obtained.

$$\frac{W}{L} * (Vgs - Vth)^2 = \frac{2 * Id}{\mu * C_0} \qquad \text{[Expression 2]}$$

A mobility μ and a capacitance value Co of a gate capacitance are values fixed at the point of time when a TFT is formed. When an EL element is made to emit light at desired emission luminance, since the relation between the emission luminance of the EL element and current density is linear, the value of a drain current Id is also fixed. Thus, expression 3 is derived by replacing the right side of the expression 2 by a constant A.

$$\frac{W}{L} * (Vgs - Vth)^2 = A \qquad \text{[Expression 3]}$$

In consideration of confining the difference in the emission luminance of the respective pixels to the range of ±n %, expression 4 and expression 5 are obtained from the expression 3. Threshold voltage Vth is an average of threshold voltages of current controlling TFTs of all pixels. The symbol ΔVth stands for a difference between an actual threshold voltage of each pixel and the threshold voltage Vth.

$$\frac{(Vgs - Vth + \Delta Vth)^2}{(Vgs - Vth)^2} \leq 1 + \frac{n}{100} \qquad \text{[Expression 4]}$$

$$1 - \frac{n}{100} \leq \frac{(Vgs - Vth - \Delta Vth)^2}{(Vgs - Vth)^2} \qquad \text{[Expression 5]}$$

If Vgs−Vth=V', expression 6 is derived from the expression 4 and the expression 5.

$$|\Delta Vth| \leq \left(\sqrt{1 + \frac{n}{100}} - 1\right) * V' \qquad \text{[Expression 6]}$$

Here, expression 7 is obtained from the expression 3.

$$V'^2 = A * L/W \qquad \text{[Expression 7]}$$

Thus, expression 8 is derived from the expression 6 and the expression 7.

$$|\Delta Vth| \leq \left(\sqrt{1 + \frac{n}{100}} - 1\right) * \sqrt{A * L/W} \qquad \text{[Expression 8]}$$

When the expression 8 is solved with respect to W/L, expression 9 is obtained.

$$\frac{W}{L} \leq \left(\sqrt{1 + \frac{n}{100}} - 1\right)^2 * \frac{A}{\Delta Vth^2} \qquad \text{[Expression 9]}$$

If the gate voltage Vgs is too high, the TFT itself is deteriorated, so that it is necessary that the gate voltage Vgs has such an intensity that an element is not broken. When a value of the gate voltage Vgs immediately before the element is broken is made $Vgs_{(max)}$, the following expression 10 is derived from the expression 3. Note that it is necessary that $Vgs_{(max)}$ is about 25 V, and is desirably 10 V or less.

$$\frac{W}{L} \geq \frac{A}{(Vgs_{(max)} - Vth)^2} \qquad \text{[Expression 10]}$$

Expression 11 is obtained from the above expressions 9 and 10.

$$\frac{A}{(Vgs_{(max)} - Vth)^2} \leq \frac{W}{L} \leq \left(\sqrt{1 + \frac{n}{100}} - 1\right)^2 * \frac{A}{\Delta Vth^2} \qquad \text{[Expression 11]}$$

If the values of ΔVth and W/L are determined in the range where the above expression 8 or 11 is satisfied, the fluctuation of the drain current Id can be suppressed to the range of ±n %.

For example, in the case where the value of the ratio W/L of the channel width W to the channel length L is fixed by a problem of design, the range of the fluctuation ΔVth of the threshold voltage is determined by the expression 8 from the value of the ratio W/L of the channel width W to the channel length L.

In the case where the fluctuation ΔVth of the threshold voltage is fixed by a fabricating process of TFTs, the range of the ratio W/L of the channel width W to the channel length L is determined by the expression 11 from the value of the fluctuation ΔVth of the threshold voltage.

By the above structure, in the light-emitting device of the present invention, the number of thin film transistors provided in each of pixels is made two to prevent a drop in an opening ratio, and it becomes possible to suppress uneven luminance due to fluctuation in the threshold voltage of the current controlling TFT included in each of the pixels.

Note that the above expressions 4 to 11 are obtained under the assumption that the difference in the emission luminance of the respective pixels is restricted to the range of ±n %. In the case where the difference in the emission luminance between adjacent pixels is restricted to the range of ±5%, the relation between the fluctuation ΔVth of the threshold voltage and the ratio W/L of the channel width W to the channel length L is expressed by the following expressions 12 and 13.

$$|\Delta Vth| \leq 0.025 * \sqrt{A * L/W} \qquad \text{[Expression 12]}$$

$$\frac{A}{(Vgs_{(max)} - Vth)^2} \leq \frac{W}{L} \leq 6.10 * 10^{-4} * \frac{A}{\Delta Vth^2} \qquad \text{[Expression 13]}$$

If the values of ΔVth and W/L are determined within the range where the above expression 12 or 13 is satisfied, the fluctuation of the drain current Id can be suppressed to the range of ±5%.

For example, in the case where the fluctuation ΔVth of the threshold voltage is fixed by a fabricating process of TFTs, the range of the ratio W/L of the channel width W to the channel length L is determined by the expression 12 from the value of the fluctuation ΔVth of the threshold voltage.

Besides, in the case where the value of the ratio W/L of the channel width W to the channel length L is fixed by a problem of design, the range of the fluctuation ΔVth of the threshold voltage is determined by the expression 13 from the value of the ratio W/L of the channel width W and the channel length L.

By the above structure, in the light-emitting device of the present invention, the number of thin film transistors provided in each of the pixels is made two to prevent a drop in the opening ratio, and it becomes possible to suppress uneven luminance due to fluctuation in threshold voltage of current controlling TFTs included in the respective pixels.

In the case where the difference in the emission luminance of the respective pixels is restricted to the range of ±3%, the relation between the fluctuation ΔVth of the threshold voltage and the ratio W/L of the channel width W to the channel length L is expressed by the following expressions 14 and 15.

$$|\Delta Vth| \leq 0.015 * \sqrt{A * L/W} \qquad \text{[Expression 14]}$$

$$\frac{A}{(Vgs_{(max)} - Vth)^2} \leq \frac{W}{L} \leq 2.22 * 10^{-4} * \frac{A}{\Delta Vth^2} \qquad \text{[Expression 15]}$$

If the values of ΔVth and W/L are determined within the range where the above expression 14 or 15 is satisfied, the fluctuation of the drain current Id can be suppressed to the range of ±3%.

For example, in the case where the fluctuation ΔVth of the threshold voltage is fixed by a fabricating process of TFTs, the range of the ratio W/L of the channel width W to the channel length L is determined by the expression 14 from the value of the fluctuation ΔVth of the threshold voltage.

Besides, in the case where the value of the ratio W/L of the channel width W to the channel length L is fixed by a problem of design, the range of the fluctuation ΔVth of the threshold voltage is determined by the expression 15 from the value of the ratio W/L of the channel width W to the channel length L.

By the above structure, in the light-emitting device of the present invention, the number of thin film transistors provided in each of pixels is made two to suppress a drop in the opening ratio, and it becomes possible to suppress uneven luminance due to fluctuation in threshold voltage of current controlling TFTs included in the respective pixels.

The structure of the present invention is as follows:

According to the present invention, there is provided a light-emitting device including a plurality of pixels, wherein:

the plurality of pixels include a plurality of switching TFTs, a plurality of current controlling TFTs, and a plurality of EL elements, emission luminance of the EL elements are controlled by video signals inputted to gate electrodes of the plurality of current controlling TFTs through the plurality of switching TFTs, the plurality of current controlling TFTs respectively include active layers, gate insulating films on the active layers, and gate electrodes on the gate insulating films, the active layers respectively include source regions, drain regions, and channel forming regions provided between the source regions and the drain regions, and when a drain current of the plurality of current controlling TFTs when the luminance of the EL element becomes maximum is Id, a mobility is μ, a gate capacitance per unit area is Co, a maximum gate voltage is $Vgs_{(max)}$, a channel width is W, a channel length is L, an average value of a threshold voltage is Vth, a deviation from the average value of the threshold voltage is ΔVth, and a difference in the emission luminance of the plurality of EL elements is within a range of ±n %, Expression 16 is satisfied.

$$A = \frac{2Id}{\mu * C_0}$$ [Expression 16]

$$\frac{A}{(Vgs_{(max)} - Vth)^2} \leq \frac{W}{L} \leq \left(\sqrt{1 + \frac{n}{100}} - 1\right)^2 * \frac{A}{\Delta Vth^2}$$

According to the present invention, there is provided a light-emitting device including a plurality of pixels, wherein:

the plurality of pixels include a plurality of switching TFTs, a plurality of current controlling TFTs, and a plurality of EL elements, emission luminance of the EL elements are controlled by video signals inputted to gate electrodes of the plurality of current controlling TFTs through the plurality of switching TFTs, the plurality of current controlling TFTs respectively include active layers, gate insulating films on the active layers, and gate electrodes on the gate insulating films, the active layers respectively include source regions, drain regions, and channel forming regions provided between the source regions and the drain regions, and when a drain current of the plurality of current controlling TFTs when the luminance of the EL element becomes maximum is Id, a mobility is μ, a gate capacitance per unit area is Co, a maximum gate voltage is $Vgs_{(max)}$, a channel width is W, a channel length is L, an average value of a threshold voltage is Vth, a deviation from the average value of the threshold voltage is ΔVth, and a difference in the emission luminance of the plurality of EL elements is within a range of ±n %, Expression 17 is satisfied.

$$A = \frac{2Id}{\mu * C_0}$$ [Expression 17]

$$|\Delta Vth| \leq \left(\sqrt{1 + \frac{n}{100}} - 1\right) * \sqrt{A * L/W}$$

According to the present invention, a light-emitting device includes a source signal line driving circuit, a gate signal line driving circuit, a pixel portion, a plurality of source signal lines, a plurality of gate signal lines, and power supply lines, wherein:

the pixel portion includes a plurality of pixels, the plurality of pixels respectively include a plurality of switching TFTs, a plurality of current controlling TFTs, and a plurality of EL elements, the EL elements respectively include anodes, cathodes, and EL layers provided between the cathodes and the anodes, gate electrodes of the plurality of switching TFTs are connected to the plurality of gate lines, ones of source regions and drain regions of the plurality of switching TFTs are connected to the plurality of source signal lines, and the other ones are connected to gate electrodes of the plurality of current controlling TFTs, source regions of the plurality of current controlling TFTs are connected to the power supply lines, and drain regions are connected to the anodes or the cathodes of the EL elements, video signals are inputted to the plurality of source signal lines by the source signal line driving circuit, the video signals inputted to the plurality of source signal lines are inputted to the gate electrodes of the plurality of current controlling TFTs through the plurality of switching TFTs so that emission luminance of the plurality of EL elements is controlled, the plurality of current controlling TFTs respectively include active layers, gate insulating films on the active layers, and gate electrodes on the gate insulating films, the active layers respectively include source regions, drain regions, and channel forming regions provided between the source regions and the drain regions, and when a drain current of the plurality of current controlling TFTs when the luminance of the EL element becomes maximum is Id, a mobility is μ, a gate capacitance per unit area is Co, a maximum gate voltage is $Vgs_{(max)}$, a channel width is W, a channel length is L, an average value of a threshold voltage is Vth, a deviation from the average value of the threshold voltage is ΔVth, and a difference in the emission luminance of the plurality of EL elements is within a range of ±n %, Expression 18 is satisfied.

$$A = \frac{2Id}{\mu * C_0}$$ [Expression 18]

$$\frac{A}{(Vgs_{(max)} - Vth)^2} \leq \frac{W}{L} \leq \left(\sqrt{1 + \frac{n}{100}} - 1\right)^2 * \frac{A}{\Delta Vth^2}$$

According to the present invention, a light-emitting device includes a source signal line driving circuit, a gate signal line driving circuit, a pixel portion, a plurality of source signal lines, a plurality of gate signal lines, and power supply lines, wherein the pixel portion includes a plurality of pixels, the plurality of pixels respectively includes a plurality of switching TFTs, a plurality of current controlling TFTs, and a plurality of EL elements, the EL elements respectively include anodes, cathodes, and EL layers provided between the cathodes and the anodes, gate electrodes of the plurality of switching TFTs are connected to the plurality of gate lines, ones of source regions and drain regions of the plurality of switching TFTs are connected to the plurality of source signal lines, and the other ones are connected to gate electrodes of the plurality of current controlling TFTs, source regions of the plurality of current controlling TFTs are connected to the power supply lines, and drain regions are connected to the anodes or the cathodes of the EL elements, video signals are inputted to the plurality of source signal lines by the source signal line driving circuit, the video signals inputted to the plurality of source signal lines are inputted to the gate electrodes of the plurality of current controlling TFTs through the plurality of switching TFTs so that emission luminance of the plurality of EL elements is controlled, the plurality of current controlling TFTs respectively include active layers, gate insulating films on the active layers, and gate electrodes on the gate insulating films, the active layers respectively include source regions, drain regions, and channel forming regions provided between the source regions and the drain regions, and when a drain current of the plurality of current controlling TFTs when the luminance of the EL element becomes maximum is Id, a mobility is μ, a gate capacitance per unit area is Co, a maximum gate voltage is $Vgs_{(max)}$, a channel width is W, a channel length is L, an average value of a threshold voltage is Vth, a deviation from the average value of the threshold voltage is ΔVth, and a difference in the emission luminance of the plurality of EL elements is within a range of ±n %, Expression 19 is satisfied.

$$A = \frac{2Id}{\mu * C_0}$$ [Expression 19]

$$|\Delta Vth| \leq \left(\sqrt{1 + \frac{n}{100}} - 1\right) * \sqrt{A * L/W}$$

The light-emitting device may be characterized in that the current controlling TFTs are n-channel TFTs and the drain regions of the current controlling TFTs are connected to the cathodes of the EL elements.

The light-emitting device may be characterized in that the current controlling TFTs are p-channel TFTs and the drain regions of the current controlling TFTs are connected to the anodes of the EL elements.

According to the present invention, there is provided a light-emitting device including a plurality of pixels, wherein:

the plurality of pixels include a plurality of switching TFTs, a plurality of current controlling TFTs, and a plurality of EL elements, emission luminance of the EL elements is controlled by video signals inputted to gate electrodes of the plurality of current controlling TFTs through the plurality of switching TFTs, the plurality of current controlling TFTs respectively include active layers, gate insulating films on the active layers, and gate electrodes on the gate insulating films, the active layers respectively include source regions, drain regions, and channel forming regions provided between the source regions and the drain regions, when a drain current of the plurality of current controlling TFTs when the luminance of the EL element becomes maximum is Id, a mobility is μ, a gate capacitance per unit area is Co, a maximum gate voltage is $Vgs_{(max)}$, a channel width is W, a channel length is L, an average value of a threshold voltage is Vth, a deviation from the average value of the threshold voltage is ΔVth, and a difference in the emission luminance of the plurality of EL elements is within a range of ±n %, Expression 20 is satisfied, and a ratio of the channel width W to the channel length L in each of the pixels is different from one another according to a color displayed by each of the pixels.

$$A = \frac{2Id}{\mu * C_0}$$ [Expression 20]

$$\frac{A}{(Vgs_{(max)} - Vth)^2} \leq \frac{W}{L} \leq \left(\sqrt{1 + \frac{n}{100}} - 1\right)^2 * \frac{A}{\Delta Vth^2}$$

According to the present invention, there is provided a light-emitting device including a plurality of pixels, wherein:

the plurality of pixels include a plurality of switching TFTs, a plurality of current controlling TFTs, and a plurality of EL elements, emission luminance of the EL elements is controlled by video signals inputted to gate electrodes of the plurality of current controlling TFTs through the plurality of switching TFTs, the plurality of current controlling TFTs respectively include active layers, gate insulating films on the active layers, and gate electrodes on the gate insulating films, the active layers respectively include source regions, drain regions, and channel forming regions provided between the source regions and the drain regions, when a drain current of the plurality of current controlling TFTs when the luminance of the EL element becomes maximum is Id, a mobility is μ, a gate capacitance per unit area is Co, a maximum gate voltage is $Vgs_{(max)}$, a channel width is W, a channel length is L, an average value of a threshold voltage is Vth, a deviation from the average value of the threshold voltage is ΔVth, and a difference in the emission luminance of the plurality of EL elements is within a range of ±n %, Expression 21 is satisfied, and a ratio of the channel width W to the channel length L in each of the pixels is different from one another according to a color displayed by each of the pixels.

$$A = \frac{2Id}{\mu * C_0}$$ [Expression 21]

$$|\Delta Vth| \leq \left(\sqrt{1 + \frac{n}{100}} - 1\right) * \sqrt{A * L/W}$$

The light-emitting device may be characterized in that the difference in the emission luminance of the plurality of EL elements is within a range of ±5%.

The light-emitting device may be characterized in that the difference in the emission luminance of the plurality of EL elements is within a range of ±3%.

The light-emitting device may be characterized in that the maximum gate voltage is 25 V.

The light-emitting device may be characterized in that the maximum gate voltage is 25 V and a ratio of the channel width W to the channel length L of each of the plurality of current controlling TFTs is 2.26×10−3≤W/L≤0.214.

The gate capacitance is formed in a portion where the channel forming region, the gate insulating film, and the gate electrode overlap with one another in each of the current controlling TFTs.

A video camera characterized by using the light-emitting device.

An image reproduction apparatus characterized by using the light-emitting device.

A head mount display characterized by using the light-emitting device.

A personal computer characterized by using the light-emitting device.

BRIEF DESCRIPTION OF THE DRAWINGS

FIGS. 8A to 8D are views showing fabricating steps of the light-emitting device of Embodiment 3;

FIGS. 9A to 9C are views showing fabricating steps of the light-emitting device of Embodiment 3;

DETAILED DESCRIPTION OF THE PREFERRED EMBODIMENTS

Figure 1:
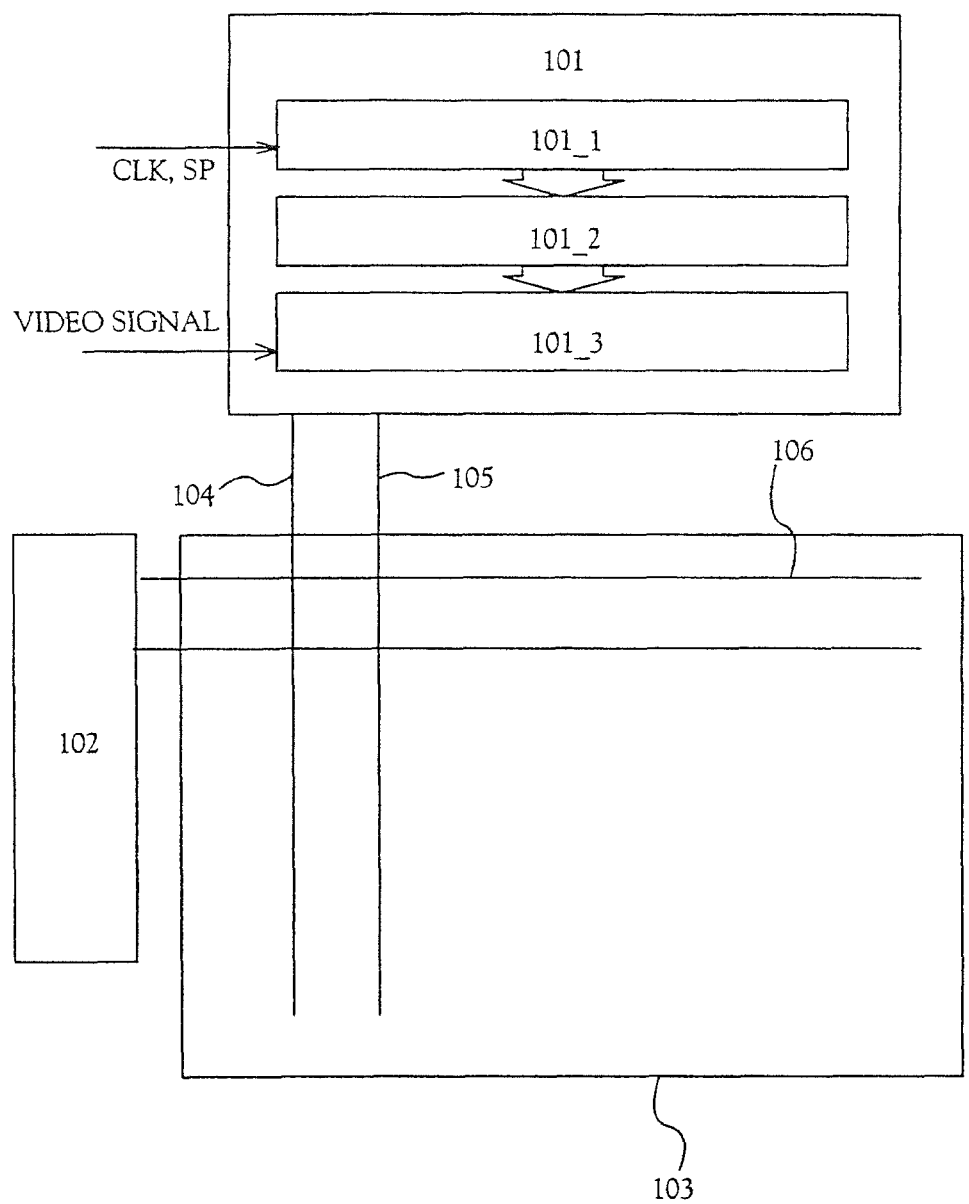
FIG. 1 is a circuit diagram of a pixel portion of a light-emitting device of Embodiment 1.

Embodiments of the present invention will be described below.

Embodiment 1

In this embodiment, an example in which the present invention is applied to an actual light-emitting device by using the above described expressions 8 and 11 will be described.

In this embodiment, a light-emitting device having a resolution of QVGA of 320×240 and a size of 4 inches will be exemplified.

A pixel size of the 4-inch QVGA light-emitting device is about 84 μm×252 μm. When an attempt to obtain definite luminance is made, the intensity of current flowing through an EL element per unit area is determined. In this embodiment, it is made 3 mA/cm² per unit area.

Thus, a drain current Id of a current controlling TFT included in each of pixels is expressed by the following expression 22.

$$Id=3*(84*10^{-4})*(252*10^{-4})=6.35*10^{-7} A \quad \text{[Expression 22]}$$

The above expression indicates a value of the drain current Id of the current controlling TFT when the opening ratio of the light-emitting device is 100%. Actually, in almost all cases, the opening ratio of the light-emitting device is not 100%. As the opening ratio of the light-emitting device is lowered, the value of an actually required drain current Id becomes large. For example, when the opening ratio of the light-emitting device of this embodiment is 30%, the value of the actually required drain current Id is obtained by the following expression 23.

$$Id=6.35*10^{-7}/0.3=2.11 \text{ μA} \quad \text{[Expression 23]}$$

When the mobility of the current controlling TFT of the light-emitting device used in this embodiment is μ=100 (m2/V sec), and the capacitance value of gate capacitance is $Co=3\times10^{-8}$ (F/cm²), a constant A is obtained from expression 24.

$$A = \frac{2*Id}{\mu * C_0} = 1.41(A) \quad \text{[Expression 24]}$$

A difference in emission luminance of the respective pixels is made to be restricted to a range of, for example, ±5%. When the gate voltage $Vgs_{(max)}$ immediately before the TFT is broken is made 25 V, and the value of the threshold voltage Vth is made 0 V, the following expressions 25 and 26 are obtained from the expressions 8 and 11.

$$|\Delta Vth| \leq 0.029 * \sqrt{L/W} \quad \text{[Expression 25]}$$

$$2.26*10^{-3} \leq \frac{W}{L} \leq \frac{8.60*10^{-4}}{\Delta Vth^2} \quad \text{[Expression 26]}$$

In the light-emitting device of the present invention, the values of ΔVth and W/L are determined in the range where the above expression 25 or 26 is satisfied, and the fluctuation of the drain current Id can be suppressed to the range of ±5%.

For example, in the case where the value of the ratio W/L of the channel width W to the channel length L is fixed to 7.5 by a problem of design, when W/L=1/7.5 is substituted in the expression 25, the following expression 27 is obtained.

$$|\Delta Vth| \leq 0.079(V) \quad \text{[Expression 27]}$$

If the fluctuation ΔVth of the threshold voltage is determined so that the expression 27 is satisfied, the fluctuation of the drain current Id can be suppressed to the range of ±5%.

Besides, for example, it is assumed that the fluctuation ΔVth of the threshold voltage is fixed by a fabricating process of TFTs, and ΔVth=0.1 V. When ΔVth=0.1 V is substituted in the expression 26, the following expression 28 is obtained.

$$2.26*10^{-3} \leq \frac{W}{L} \leq 0.086 \quad \text{[Expression 28]}$$

If the ratio W/L of the channel length L and the channel width W is determined so that the expression 28 is satisfied, the fluctuation of the drain current Id can be suppressed to the range of ±5%.

By the above structure, in the light-emitting device of the present invention, the number of thin film transistors provided in each of the pixels is made two to prevent a drop in the opening ratio, and it becomes possible to suppress uneven luminance due to fluctuation in the threshold voltage of the current controlling TFTs included in the respective pixels.

Note that in this embodiment, although the description has been given of the example in which the fluctuation of the drain current Id is suppressed to the range of ±5%, the present invention is not limited to this numerical value.

Embodiment 2

A driving method of a light-emitting device of the present invention will be described with reference to FIGS. 1 to 3.

FIG. 1 is a top view of a light-emitting device of the present invention. Reference numeral 101 designates a source signal line driving circuit; 102, a gate signal line driving circuit; and 103, a pixel portion. In this embodiment, although one source signal line driving circuit and one gate signal line driving circuit are provided, the present invention is not limited to this structure. Two source signal line driving circuits may be provided, or two gate signal line driving circuits may be provided.

The source signal line driving circuit 101 includes a shift register 101_1, a level shift 101_2, and a sampling circuit 101_3. Note that the level shift 101_2 has only to be used as the need arises, and it may not be always used. Besides, although this embodiment is made to have such a structure that the level shift 101_2 is provided between the shift register 101_1 and the sampling circuit 101_3, the present invention is not limited to this structure. A structure may be such that the level shift 101_2 is incorporated in the shift register 101_1.

In the pixel portion 103, a source signal line 104 connected to the source signal line driving circuit 101 intersects with a gate signal line 106 connected to the gate signal line driving circuit 102. A power supply line 105 is connected to a power source so that it is kept a constant potential (power source potential).

The gate signal line driving circuit 102 includes a shift register and a buffer (both are not shown). It may include a level shift.

A clock signal (CLK) as a panel control signal, and a start pulse (SP) are inputted to the shift register 101_1. A sampling signal for sampling a video signal is outputted from the shift register 101_1. The outputted sampling signal is inputted to the level shift 101_2, and is outputted after the amplitude of its potential becomes high.

The sampling signal outputted from the level shift 101_2 is inputted to the sampling circuit 101_3. At the same time, the video signal is inputted to the sampling circuit 101_3 through a video signal line (not shown).

In the sampling circuit 101_3, the inputted video signal is sampled by the sampling signal, and is inputted to the source signal line 104.

Figure 2:
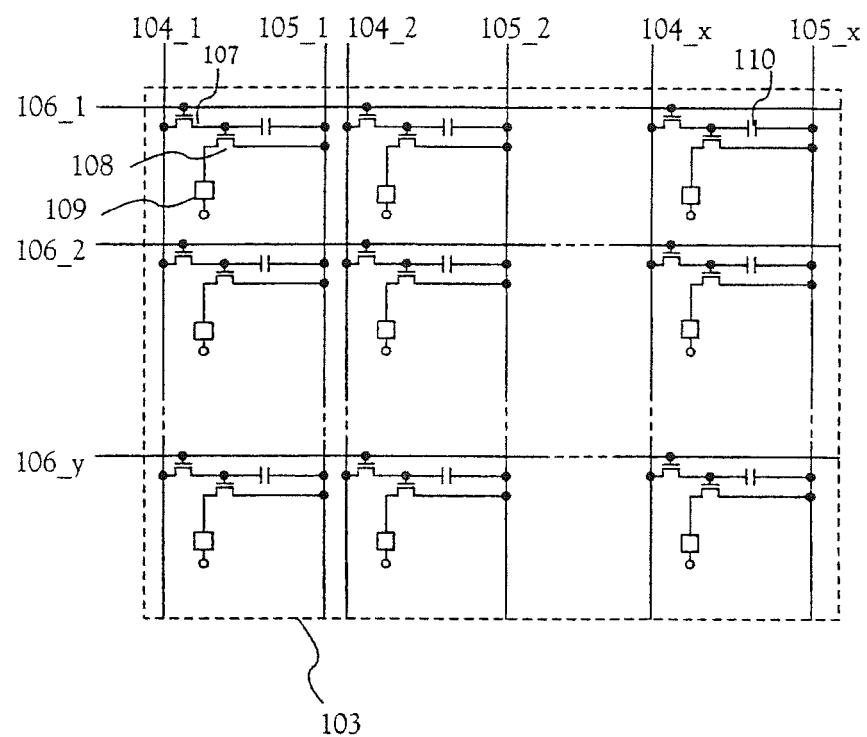
FIG. 2 is an upper plane block diagram of the light-emitting device of Embodiment 1.

FIG. 2 shows a structure of the pixel portion 103 of the light-emitting device shown in FIG. 1. A gate signal line (106_1 to 106_y) through which a selection signal from the gate signal line driving circuit 102 is inputted is connected to a gate electrode of a switching TFT 107 included in each of pixels. Besides, one of a source region and a drain region of the switching TFT 107 included in each of the pixels is connected to a source signal line (104_1 to 104_x) through which the video signal is inputted, and the other is connected to a gate electrode of a current controlling TFT 108 included in each of the pixels and a capacitor 110 included in each of the pixels, respectively.

A source region of the current controlling TFT 108 included in each of the pixels is connected to a power supply line (105_1 to 105_x) and a drain region is connected to an anode or a cathode of an EL element 109. The power supply line (105_1 to 105_x) is connected to the capacitor 110 included in each of the pixels. Note that in this embodiment, although the structure including the capacitor 110 is shown, the capacitor 110 may not be necessarily provided.

The EL element 109 includes an anode, a cathode, and an EL layer provided between the anode and the cathode. In the case where the anode of the EL element 109 is connected to the drain region of the current controlling TFT 108, the anode of the EL element 109 becomes a pixel electrode, and the cathode becomes a counter electrode. On the contrary, in the case where the cathode of the EL element 109 is connected to the drain region of the current controlling TFT 108, the anode of the EL element 109 becomes a counter electrode, and the cathode becomes a pixel electrode.

Figure 3:
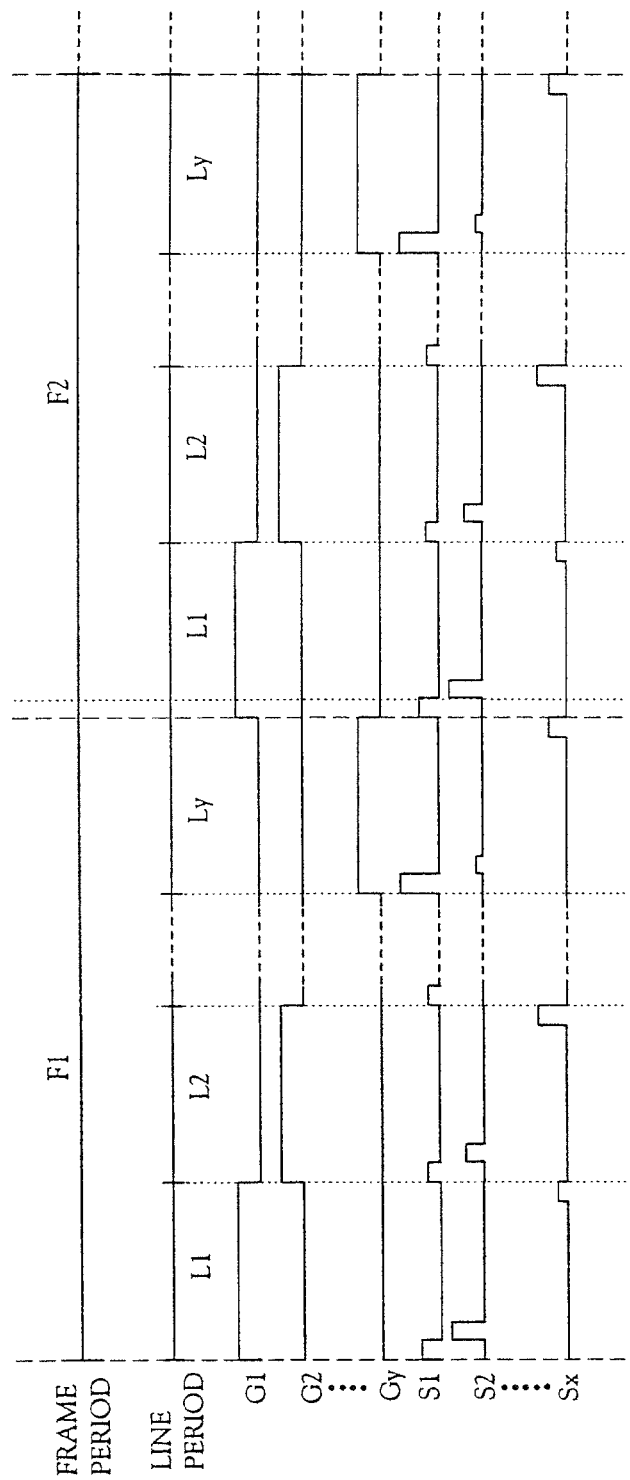
FIG. 3 is a timing chart showing a driving method of the light-emitting device of Embodiment 1.
Figure 4:
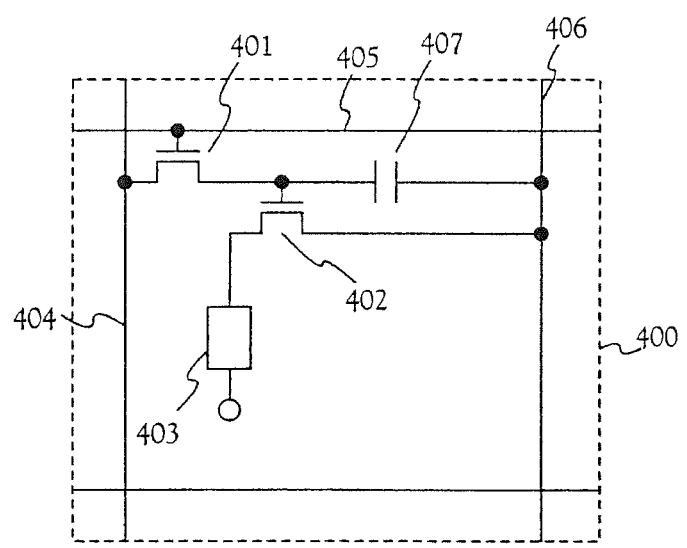
FIG. 4 is a circuit diagram of a light-emitting device of the present invention.
Figure 5:
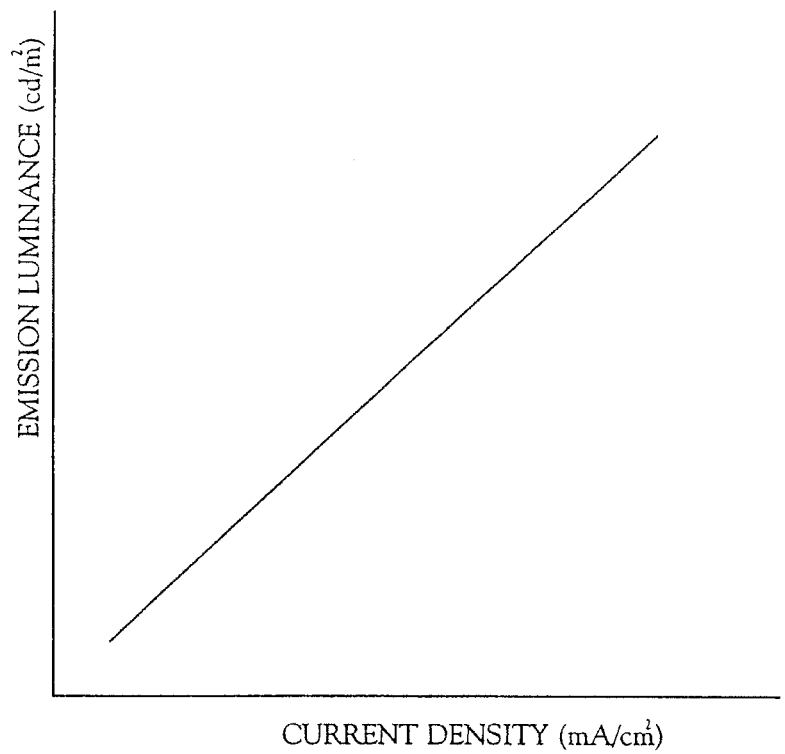
FIG. 5 is a correlation view of emission luminance of an EL element and current density.
Figure 6:
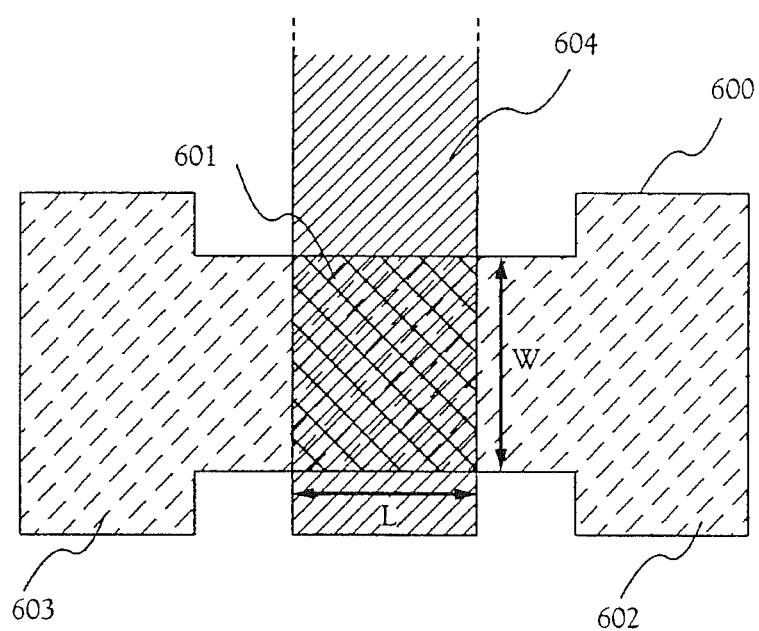
FIG. 6 is a top view of a TFT.

FIG. 3 shows a timing chart in the case where the light-emitting device shown in FIGS. 1 and 2 is driven by an analog system. A period from a point when one gate signal line is selected to a point when another gate signal line is next selected is called one line period (L). Note that in the present specification, that a gate signal line is selected means that a selection signal having such a potential that a switching TFT comes to have an on state is inputted to the gate signal line.

A period from a point when one image is displayed to a point when a next image is displayed corresponds to one frame period (F). In the case of the light-emitting device shown in FIG. 2, since there are y gate signal lines 104, y line periods (L1 to Ly) are provided in one frame period.

First, the potential (power source potential) of the power supply line (105_1 to 105_x) is kept constant. The potential of the counter electrode is also kept constant. The potential of the counter electrode has a potential difference from the power source potential to such a degree that the EL element emits light when the power source potential is applied to the pixel electrode of the EL element.

In a first line period (L1), the gate signal line 106_1 is selected by the selection signal inputted from the gate signal line driving circuit 102 through the gate signal line 106_1, and all the switching TFTs 107 connected to the gate signal line 106_1 come to have on states. Then, video signals are sequentially inputted to the source signal lines (104_1 to 104_x) from the source signal line driving circuit 101. The video signals inputted to the source signal lines (104_1 to 104_x) are respectively inputted to the gate electrodes of the current controlling TFTs 108 through the switching TFTs 107.

The amount of current flowing through a channel forming region of the current controlling TFT 108 is controlled by a gate voltage Vgs of a potential difference between the gate electrode and the source region of the current controlling TFT 108. Thus, the potential given to the pixel electrode of the EL element 109 is determined by the height of the potential of the video signal inputted to the gate electrode of the current controlling TFT 108. Accordingly, the EL element 109 is controlled by the potential of the video signal and emits light.

When the above operation is repeated and the input of the video signals to the source signal lines (104_1 to 104_x) is ended, the first line period (L1) is ended. Note that a combination of a period up to the end of the input of the video signals to the source signal lines (104_1 to 104_x) and a horizontal retrace period may be made one line period. Next, a second line period (L2) is started, the gate signal line 106_2 is selected by a selection signal, and video signals are sequentially inputted to the source signal liens (104_1 to 104_x) similarly to the first line period (L1).

When all the gate signal lines (106_1 to 106_y) are selected, all line periods (L1 to Ly) are ended. When all the line periods (L1 to Ly) are ended, one frame period is ended.

In one frame period, every pixel causes a display, and one image is formed. Note that a combination of all the line periods (L1 to Ly) and a vertical retrace period may be made one frame period.

As described above, the amount of light emission of the EL element is controlled by the potential of the video signal, and a gradation display is carried out by the control of the amount of light emission.

Embodiment 3

In this embodiment, a detailed description will be given of a method of fabricating a pixel portion and TFTs (n-channel TFT and p-channel TFT) of a driving circuit provided on the periphery of the pixel portion on the same substrate at the same time.

Figure 7A:
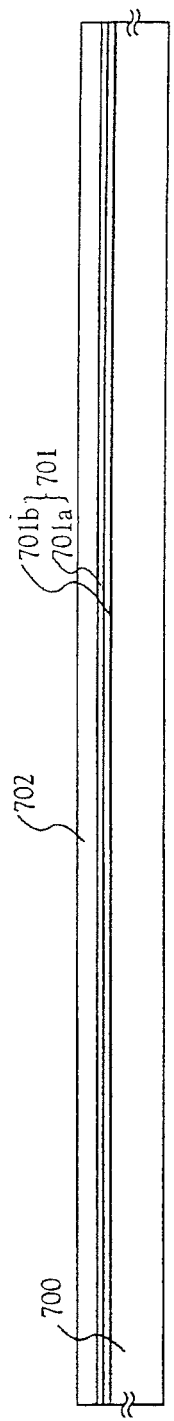
FIGS. 7A to 7D are views showing fabricating steps of a light-emitting device of Embodiment 3.

First, as shown in FIG. 7A, an under film 701 made of an insulating film such as a silicon oxide film, a silicon nitride film, or a silicon nitride oxide film is formed on a substrate 700 made of glass such as barium borosilicate glass or alumino borosilicate glass, typified by #7059 glass or #1737 glass of Corning Inc. For example, a silicon nitride oxide film 701a fabricated from $SiH_4$, $NH_3$ and $N_2O$ by a plasma CVD method is formed to a thickness of 10 to 200 nm (preferably 50 to 100 nm), and a hydrogenated silicon nitride oxide film 701b similarly fabricated from $SiH_4$ and $N_2O$ is formed to a thickness of 50 to 200 nm (preferably 100 to 150 nm) to form a laminate. In this embodiment, although the under film 701 is shown as the two-layer structure, the film may be formed of a single layer film of the foregoing insulating film or as a laminate structure of more than two layers.

Next, a semiconductor film (amorphous semiconductor film) 702 having a thickness of 20 to 150 nm (preferably 30 to 80 nm) and an amorphous structure is formed by a well-known method such as a plasma CVD method or a sputtering method. In this embodiment, an amorphous silicon film was formed to a thickness of 55 nm by the plasma CVD method. The semiconductor film having the amorphous structure includes an amorphous semiconductor film and a microcrystalline semiconductor film, and a compound semiconductor film having an amorphous structure, such as an amorphous silicon germanium film, may also be applied. Since the under film 701 and the amorphous silicon film 702 can be formed by the same film forming method, both may be continuously formed. When the under film is not exposed to the air after its formation, it becomes possible to prevent contamination of its surface, and the fluctuation of characteristics of fabricated TFTs and the change of threshold voltage can be decreased (FIG. 7A).

Next, a crystalline semiconductor film is formed by a thermal crystallization method using a catalytic element. In the case where the catalytic element is used, it is desirable to use a technique disclosed in Japanese Patent Laid-Open No. Hei 7-130652 or No. Hei 8-78329.

First, a silicon oxide film having a thickness of 150 nm was formed on the amorphous semiconductor film 702, and patterning was carried out to form masks 703 to 705. The silicon oxide film may be continuously formed together with the amorphous semiconductor film 702, or may be continuously formed together with the under film 701 and the amorphous semiconductor film 702.

Figure 7B:
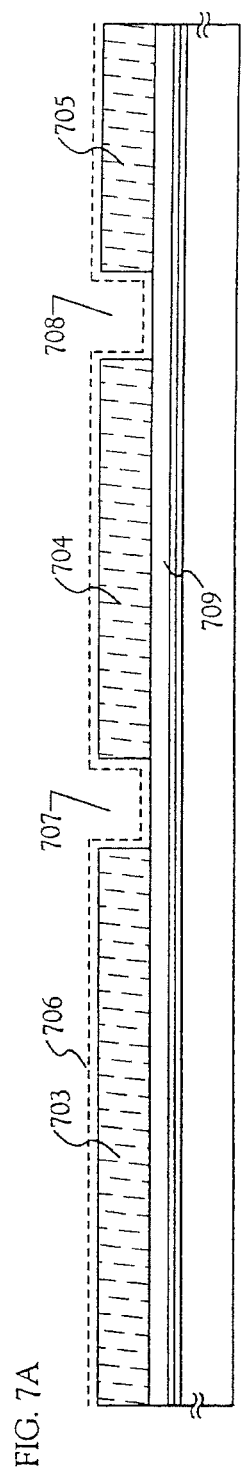

Next, a nickel acetate salt solution containing nickel of 10 ppm in terms of weight was coated. By this, a nickel containing layer 706 was formed, and the nickel containing layer 706 was brought into contact with the amorphous semiconductor film 702 only at bottom portions of opening portions 707 and 708 (FIG. 7B).

Next, a heat treatment at 500 to 650° C. for 4 to 24 hours, for example, at 570° C. for 14 hours was carried out to form a crystalline semiconductor film 709. In this crystallization process, a portion of the amorphous semiconductor film 702 with which nickel is in contact is first crystallized, and crystallization proceeds in the horizontal direction from that. The crystalline semiconductor film 709 formed in this way is made of an aggregate of rod-like or needle-like crystals, and the respective crystals grow with certain specific directionality when they are macroscopically seen, so that there is a merit that crystallinity is uniform (FIG. 7B).

Note that in the above two techniques, as a usable catalytic element, in addition to nickel (Ni), an element such as germanium (Ge), iron (Fe), palladium (Pd), tin (Sn), lead (Pb), cobalt (Co), platinum (Pt), copper (Cu), or gold (Au) may be used.

Next, phosphorus was doped so that regions 710 and 711 added with phosphorus were provided in regions where the crystalline semiconductor film 709 was exposed at the opening portions 707 and 708.

Figure 7C:
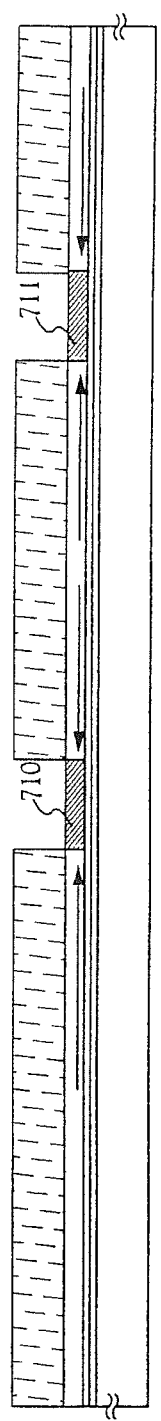

In this state, when a heat treatment at 550 to 800° C. for 5 to 24 hours, for example, at 600° C. for 12 hours was carried out in a nitrogen atmosphere, the regions 710 and 711 where phosphorus was added into the crystalline semiconductor film 709 function as gettering cites, so that it was possible to make the catalytic element remaining in the crystalline semiconductor film 709 segregate into the regions 710 and 711 added with phosphorus (FIG. 7C).

Then, the masks 703 to 705 and the regions 710 and 711 where phosphorus was added were removed by etching, and patterning was carried out, so that it was possible to obtain island-like semiconductor films 712 to 715 where the concentration of the catalytic element used in the step of crystallization was reduced to $1 \times 10^{17}$ atms/cm$^3$ or less.

Note that in this embodiment, although crystallization of the amorphous semiconductor film 702 was carried out by using the catalytic element, the present invention is not limited to this method, but a well-known crystallization technique can be used. As the well-known crystallization technique, for example, a heat crystallization method using an electronic furnace, a laser annealing crystallization method using laser light, and a lamp annealing crystallization method using infrared light can be named as a well-known crystallization method.

In order to fabricate the crystalline semiconductor film by the laser crystallization method, a pulse oscillation type or continuous-wave excimer laser, YAG laser, or $YVO_4$ laser is used. In the case where such laser is used, it is appropriate that there is used a method in which laser light radiated from a laser oscillator is collected by an optical system into a linear beam and is irradiated to the amorphous semiconductor film Although the condition of crystallization should be properly selected by an operator, in the case where the excimer laser is used, a pulse oscillation frequency is made 300 Hz, and a laser energy density is made 100 to 400 mJ/cm$^2$ (typically 200 to 300 mJ/cm$^2$). In the case where the YAG laser is used, it is appropriate that the second harmonic is used, a pulse oscillation frequency is made 30 to 300 Hz, and a laser energy density is made 300 to 600 mJ/cm$^2$ (for example, 350 to 500 mJ/cm$^2$). Then, laser light collected into a linear shape with a width of 100 to 1000 μm, for example, 400 μm is irradiated to the whole surface of the substrate, and an overlapping ratio (overlap ratio) of the linear laser light at this time is made 50 to 90%.

Besides, before the step of crystallization, although depending on the hydrogen content of the amorphous semiconductor film, crystallization may be carried out after a heat treatment at 400 to 500° C. for about 1 hour is carried out to make the hydrogen content 5 atom % or less. When the amorphous semiconductor film is crystallized, since atoms are rearranged and the film becomes dense, the thickness of the fabricated crystalline semiconductor film was decreased by about 1 to 15% from the initial thickness of the amorphous semiconductor film.

The island-like semiconductor layers 712 to 715 are formed to a thickness of 25 to 80 nm (preferably 30 to 60 nm).

Figure 7D:

Next, a first shape gate insulating film 716 covering the island-like semiconductor layers 712 to 715 is formed. The first shape gate insulating film 716 is formed of an insulating film having a thickness of 40 to 150 nm and containing silicon by using a plasma CVD method or a sputtering method. In this embodiment, this film is formed of a silicon nitride oxide film having a thickness of 120 nm. Of course, the gate insulating film is not limited to such silicon nitride oxide film, but another insulating film containing silicon may be used as a single layer or a laminate structure. For example, in the case where a silicon oxide film is used, TEOS (Tetraethyl Orthosilicate) and $O_2$ are mixed with each other by the plasma CVD method, a reaction pressure is made 40 Pa, a substrate temperature is made 300 to 400° C., and discharge is made at a high frequency (13.56 MHz) power density 0.5 to 0.8 W/cm$^2$, so that the film can be formed. Thereafter, the silicon oxide film fabricated in this way is subjected to heat annealing at 400 to 500° C. so that excellent characteristics as the gate insulating film can be obtained (FIG. 7D).

Then, a first conductive film 718 and a second conductive film 719 for forming a gate electrode are formed on the first shape gate insulating film 716. In this embodiment, the first conductive film 718 is formed of Ta (tantalum) and to a thickness of 50 to 100 nm, and the second conductive film 719 is formed of W (tungsten) and to a thickness of 100 to 300 nm (FIG. 8A).

The Ta film is formed by a sputtering method, and a target of Ta is sputtered by Ar. In this case, when a suitable amount of Xe or Kr is added to Ar, it is possible to relieve internal stress of the Ta film and to prevent peeling of the film Although the resistivity of a α-phase Ta film is about 20 μΩcm and can be used as the gate electrode, the resistivity of a β-phase Ta film is about 180 μΩcm and is unsuitable for the gate electrode. In order to form the α-phase Ta film, if tantalum nitride having crystal structure close to the α phase of Ta is formed to a thickness of about 10 to 50 nm as an under layer of Ta, the α-phase Ta film can be easily obtained.

In the case where the W film is formed, the film is formed by the sputtering method using W as a target. In addition to this, the film can also be formed by a thermal CVD method using tungsten hexafluoride (WF$_6$). In any case, in order to use the film as the gate electrode, it is necessary to lower the resistance, and it is desirable that the resistivity of the W film is made 20 μΩcm or less. Although the resistivity of the W film can be lowered by enlarging crystal grains, in the case where a lot of impurity elements of oxygen or the like exist in W, crystallization is hindered and the resistivity becomes high. From this, in the case of the sputtering method, a W target of purity 99.9999% or 99.99% is used, and further, the W film is formed while arrangements are thoroughly made to prevent an impurity from mixing from a vapor phase at the film formation, so that a resistivity of 9 to 20 μΩcm can be realized.

Note that in this embodiment, although the first conductive film 718 is made of Ta, and the second conductive film 719 is made of W, the present invention is not particularly limited, and either film may be formed of an element selected from Ta, W, Ti, Mo, Al, and Cu, or an alloy material or a compound material containing the above element as its main ingredient. Besides, a semiconductor film typified by a polycrystalline silicon film doped with an impurity element such as phosphorus may be used. As examples of combinations other than this embodiment, it is preferable to form the film by a combination in which the first conductive film is formed of tantalum nitride (TaN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, resist masks 720 to 726 are formed, and a first etching treatment for forming electrodes and wiring lines is carried out. In this embodiment, an ICP (Inductively Coupled Plasma) etching method is used, in which CF$_4$ and Cl$_2$ are mixed in an etching gas, and an RF (13.56 MHz) power of 500 W is applied to a coil type electrode under a pressure of 1 Pa to generate plasma. An RF (13.56 MHz) power of 100 W is also applied to the side of the substrate (sample stage) and a substantially negative self bias voltage is applied. In the case where CF$_4$ and Cl$_2$ are mixed with each other, both the W film and the Ta film are etched to the same degree.

Under the above etching condition, by making the shapes of the resist masks suitable, end portions of a first conductive layer and a second conductive layer become taper-shaped by the effect of the bias voltage applied to the substrate side. The angle of the taper portion becomes 15 to 45°. In order to carry out the etching without leaving a residue on the gate insulating film, it is appropriate that an etching time is increased at a rate of about 10 to 20%. Since the selection ratio of the silicon nitride oxide film to the W film is 2 to 4 (typically 3), a surface on which the silicon nitride oxide film is exposed is etched by an over etching treatment by about 20 to 50 nm. In this way, first shape conductive layers 727 to 733 made of first conductive layers and second conductive layers (first shape first conductive layers 722a to 733a and first shape second conductive layers 722b to 733b) are formed by the first etching treatment. Reference numeral 750 designates a second shape gate insulating film, and regions which are not covered with the first shape conductive layers 727 to 733 are etched by about 20 to 50 nm so that thinned regions are formed (FIG. 8B).

Then, a first doping treatment is carried out to add an impurity element to give an n type. Doping may be carried out by an ion doping method or an ion injecting method. The condition of the ion doping method is that a dosage is $1 \times 10^{13}$ to $5 \times 10^{14}$ atoms/cm$^2$, and an acceleration voltage is 60 to 100 keV. As the impurity element to give the n type, although an element belonging to group 15, typically phosphorus (P) or arsenic (As) is used, phosphorus is used here. In this case, The first shape conductive layers 728, 729, 731, and 733 become masks to the impurity element to give the n type, and first impurity regions 734 to 737 are formed in a self aligning manner. The impurity element to give the n type in the concentration range of $1 \times 10^{20}$ to $1 \times 10^{21}$ atoms/cm$^3$ is added to the first impurity regions 734 to 737 (FIG. 8B).

Next, as shown in FIG. 8C, a second etching treatment is carried out. The ICP etching method is similarly used, in which CF$_4$, Cl$_2$ and O$_2$ are mixed in an etching gas, and an RF power (13.56 MHz) of 500 W is applied to a coil type electrode under a pressure of 1 Pa to generate plasma. An RF (13.56 MHz) power of 50 W is applied to the side of the substrate (sample stage) and a low self bias voltage as compared with the first etching treatment is applied. The W film is anisotropically etched under the condition like this, and the Ta film as the first conductive layers is anisotropically etched at an etching rate lower than that to form second shape conductive layers 738 to 744 (second shape first conductive layers 738a to 744a and second shape second conductive layers 738b to 744b). Reference numeral 745 designates a third shape gate insulating film, and regions which are not covered with the second shape conductive layers 738 to 744 are further etched by about 20 to 50 nm so that thinned regions are formed.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, $WF_6$ as fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 8D, a second doping treatment is carried out. In this case, a dosage is made lower than that of the first doping treatment and under the condition of a high acceleration voltage, an impurity element to give the n type is doped. For example, an acceleration voltage is made 70 to 120 keV, and the treatment is carried out at a dosage of $1 \times 10^{13}$ atoms/cm$^2$, so that new impurity regions are formed inside of the first impurity regions formed into the island-like semiconductor layers in FIG. 8B. Doping is carried out in such a manner that the second shape conductive layers 739, 740, 742 and 744 are used as masks to the impurity element and the impurity element is added also to the regions under the second conductive layers 739a, 740a, 742a and 744a. In this way, third impurity regions 746b to 749b overlapping with the second conductive layers 739a, 740a, 742a and 744a, and second impurity regions 746a to 749a between the first impurity regions and the third impurity regions are formed. The impurity element to give the n type is made to have a concentration of $1 \times 10^{17}$ to $1 \times 10^{19}$ atoms/cm$^3$ in the second impurity regions, and a concentration of $1 \times 10^{16}$ to $1 \times 10^{18}$ atoms/cm$^3$ in the third impurity regions.

Then, as shown in FIG. 9A, fourth impurity regions 753a and 754a, fifth impurity regions 753b and 754b, sixth impurity regions 753c and 754c having a conductivity type opposite to the former conductivity type are formed in the island-like semiconductor layers 713 and 715 forming p-channel TFTs. The second conductive layers 740 and 744 are used as masks to an impurity element, and the impurity regions are formed in a self aligning manner. At this time, the whole surfaces of the island-like semiconductor layers 712 and 714 forming n-channel TFTs are covered with resist masks 751 and 752. Phosphorus is added to the impurity regions 753a, 753b and 753c at different concentrations, respectively, and phosphorus is added to the impurity regions 754a, 754b and 754c at different concentrations, respectively. The regions are formed by an ion doping method using diborane ($B_2H_6$) and the impurity concentration is made $2 \times 10^{20}$ to $2 \times 10^{21}$ atoms/cm$^3$ in any of the regions.

By the steps up to this, the impurity regions are formed in the respective island-like semiconductor regions. The second shape second conductive layers 739, 740, 742, and 744 overlapping with the island-like semiconductor layers function as gate electrodes. The layer 741 functions as an island-like source signal line, the layer 738 functions as a wiring line, and the layer 743 functions as a gate signal line.

A step of activating the impurity elements added in the respective island-like semiconductor layers for the purpose of controlling the conductivity type in this way, as shown in FIG. 9B, is carried out. This step is carried out by a thermal annealing method using a furnace annealing oven. In addition, a laser annealing method or a rapid thermal annealing method (RTA method) can be applied. The thermal annealing method is carried out in a nitrogen atmosphere having an oxygen content of 1 ppm or less, preferably 0.1 ppm or less and at 400 to 700° C., typically 500 to 600° C. In this embodiment, a heat treatment at 500° C. for 4 hours is carried out. However, in the case where a wiring material used for the second conductive layers 738 to 744 is weak to heat, it is preferable that the activation is carried out after an interlayer insulating film (containing silicon as its main ingredient) is formed to protect the wiring line or the like.

Further, a heat treatment at 300 to 450° C. for 1 to 12 hours is carried out in an atmosphere containing hydrogen of 3 to 100%, so that a step of hydrogenating the island-like semiconductor layers is carried out. This step is a step of terminating dangling bonds in the semiconductor layer by thermally excited hydrogen. As another means for hydrogenation, plasma hydrogenation (using hydrogen excited by plasma) may be carried out.

Next, a first interlayer insulating film 755 having a thickness of 100 to 200 nm is formed from a silicon nitride oxide film A second interlayer insulating film 756 made of an organic insulator material is formed thereon. Next, an etching step for forming contact holes is carried out.

Then, in a driving circuit 806, source wiring lines 757 and 758 in contact with source regions of the island-like semiconductor layers and drain wiring lines 759 and 760 in contact with drain regions are formed. In a pixel portion 807, a connection electrode 761, source wiring lines 761 and 762, and drain wiring lines 763 and 764 are formed (FIG. 9C). By this connection electrode 761, the island-like source signal line 741 is electrically connected to the switching TFT 804.

In the manner as described above, the driving circuit 806 including an n-channel TFT 801 and a p-channel TFT 802 and the pixel portion 807 including a switching TFT 804 and a current controlling TFT 805 can be formed on the same substrate. In the present specification, such a substrate is called an active matrix substrate for convenience.

The n-channel TFT 801 of the driving circuit 806 includes a channel forming region 788, the third impurity region 746b (GOLD region) overlapping with the second shape second conductive layer 739 forming the gate electrode, the second impurity region 746a (LDD region) in contact with the third impurity region 746b, and the first impurity region 734 functioning as a source region or a drain region. The p-channel TFT 802 includes a channel forming region 789, the fourth impurity region 753c overlapping with the second conductive layer 740 forming the gate electrode, the fifth impurity region 753b in contact with the fourth impurity region 753c, and the sixth impurity region 753a functioning as a source region or a drain region.

The switching TFT 804 of the pixel portion includes a channel forming region 790, the third impurity region 748b (GOLD region) overlapping with the second shape second conductive layer 742 forming the gate electrode, the second impurity region 748a (LDD region) in contact with the third impurity region 748b, and the first impurity region 736 functioning as a source region or a drain region. The current controlling TFT 805 includes a channel forming region 791, the fourth impurity region 754c overlapping with the second shape second conductive layer 744 forming the gate electrode, the fifth impurity region 754b in contact with the fourth impurity region 754c, and the sixth impurity region 754a functioning as a source region or a drain region.

Figures 10A, 10B:
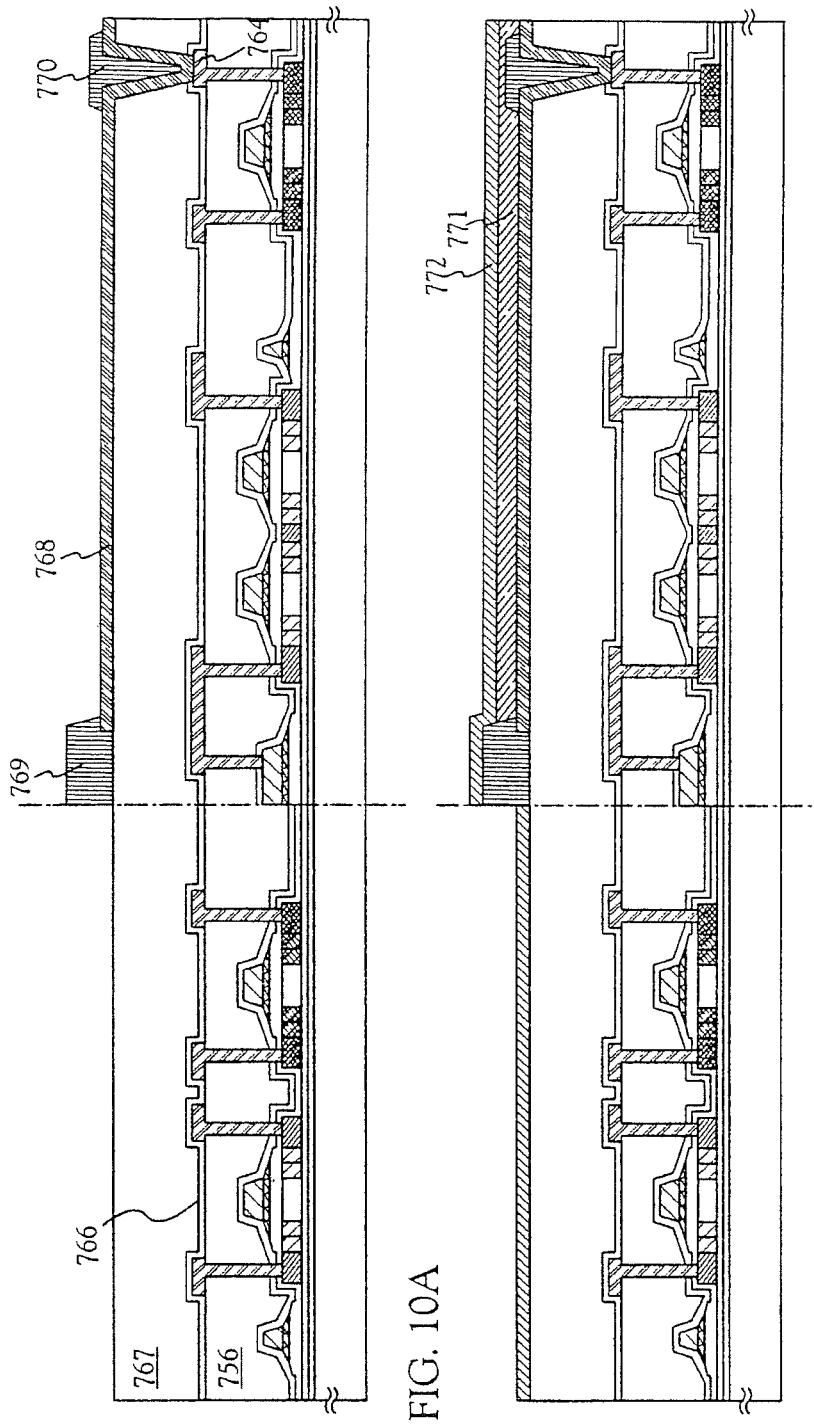
FIGS. 10A and 10B are views showing fabricating steps of the light-emitting device of Embodiment 3.

Next, as shown in FIG. 10A, a first passivation film 766 is formed to a thickness of 50 to 500 nm (typically 200 to 300 nm). In this embodiment, as the first passivation film 766, a silicon nitride oxide film having a thickness of 300 nm is used. A silicon nitride film may be substituted for this. Note that it is effective to carry out a plasma treatment using a gas containing hydrogen, such as $H_2$ or $NH_3$, before the silicon nitride oxide film is formed. Hydrogen excited by this pretreatment is supplied to the second interlayer insulating film 756, and the film quality of the first passivation film 766 is improved by carrying out a heat treatment. At the same time, since hydrogen added to the second interlayer insulating film 756 is diffused to the lower layer side, the active layer can be effectively hydrogenated.

Next, a third interlayer insulating film 767 made of an organic resin is formed. As the organic resin, polyimide, polyamide, acryl, BCB (benzocyclobutene) or the like can be used. Especially, since the third interlayer insulating film 767 has rather the meaning of flattening, acryl excellent in flatness is desirable. In this embodiment, an acryl film is formed to such a thickness that stepped portions formed by the TFTs can be adequately flattened. It is appropriate that the thickness is preferably made 1 to 5 µm (more preferably 2 to 4 µm) (FIG. 10A).

Next, a contact hole reaching the drain wiring line 764 is formed in the third interlayer insulating film 767 and the first passivation film 766, and a pixel electrode 768 is formed. In this embodiment, an indium-tin oxide (ITO) film is formed to a thickness of 110 nm, and patterning is carried out to form the pixel electrode 768. Besides, a transparent electrode in which zinc oxide (ZnO) of 2 to 20% is mixed with indium oxide may be used. This pixel electrode 768 corresponds to an anode of an EL element.

Next, an organic resin film is formed on the pixel electrode 768 and the third interlayer insulating film 767, and the organic resin film is patterned, so that a bank 769 and a flattening portion 770 are formed. In this embodiment, as the organic resin film, an acryl film or a polyimide film having a thickness of 1 to 2 µm was used.

The bank 769 is formed into a stripe shape between a pixel and a pixel to separate light-emitting layers or EL layers of adjacent pixels. In this embodiment, although the bank 769 is formed along the source wiring line 741, it may be formed along the gate wiring line 743. Note that a pigment or like may be added to the resin material forming the bank 769 so that the bank 769 is used as a light shielding film.

The flattening portion 770 is provided on a portion where the pixel electrode 768 is connected with the drain wiring line 764 of the current controlling TFT 805. Since there is a case where the connection of the pixel electrode 768 with the drain wiring line 764 is cut off by a stepped portion of the contact hole, it is desirable to make flattening by providing the flattening portion 770 in order to prevent poor light emission of an EL layer 771 formed later. Note that the bank 769 and the flattening portion 770 may not be formed to the same thickness, and can be suitably set in accordance with the thickness of the later formed EL layer 771.

Next, the EL layer 771 and a cathode (MgAg electrode) 722 are continuously formed by using a vacuum evaporation method without exposing to the air. Note that it is appropriate that the thickness of the EL layer 771 is made 80 to 200 nm (typically 100 to 120 nm), and the thickness of the cathode 772 is made 180 to 300 nm (typically 200 to 250 nm). Note that in this embodiment, although only one pixel is shown, at this time, an EL layer emitting red light, an EL layer emitting green light, and an EL layer emitting blue light are formed at the same time.

In this step, the EL layer 771 is sequentially formed for a pixel corresponding to red, a pixel corresponding to green, and a pixel corresponding to blue. However, since the EL layer 771 has poor resistance against a solution, the layer must be formed individually for respective colors without using a photolithography technique. Then, it is preferable that portions other than a desired pixel are concealed by using metal masks, and the EL layer 771 is selectively formed on only a necessary portion.

That is, first, a mask for concealing all portion other than the pixel corresponding to red is set, and the EL layer emitting red light is selectively formed using the mask. Next, a mask for concealing all portion other than the pixel corresponding to green is set, and the EL layer emitting green light is selectively formed using the mask. Next, similarly, a mask for concealing all portion other than the pixel corresponding to blue is set, and the EL layer emitting blue light is selectively formed using the mask. Note that here, although the recitation is such that different masks are used for the respective pixels, the same mask may be commonly used. Besides, it is preferable that the treatment is carried out without breaking a vacuum until the EL layers are formed for all pixels.

Note that in this embodiment, although the EL layer 771 is made to have a single layer structure of only a light-emitting layer, the EL layer may include a hole transporting layer, a hole injecting layer, an electron transporting layer, an electron injecting layer, or the like in addition to the light-emitting layer. Like this, various examples have been already reported with respect to the combination, and any structure of those may be used. As the EL layer 771, a well-known material can be used. As the well-known material, in view of EL driving voltage, it is preferable to use an organic material.

Next, the cathode 772 is formed. Although this embodiment shows an example in which a MgAg electrode is used as a cathode of an EL element, another well-known material can be used.

In this way, an active matrix substrate having a structure as shown in FIG. 10B is completed. Note that it is effective that after the bank 769 and the flattening portion 770 are formed, steps up to the formation of the cathode 772 are continuously carried out by using a thin film forming apparatus of a multichamber system (or an inline system) without opening to the air.

In this embodiment, the switching TFT 804 is made to have a double gate structure, and by making the double gate structure, there is obtained a structure in which two TFTs are substantially connected in series with each other, and there is a merit that an off current value can be decreased. Although this embodiment adopts the double gate structure, a single gate structure may be adopted, or a triple gate structure or a multigate structure having more gates may be adopted.

Note that actually, when the state of FIG. 10B is completed, it is preferable to make packaging (sealing) by a protective film (laminate film, ultraviolet ray curing resin film, etc.), which has high airtightness and hardly causes degassing, or a translucent sealing member so as to prevent exposure to the outer air. At that time, if the inside of the sealing member is made an inert atmosphere or a hygroscopic material (for example, barium oxide) is disposed in the inside, the reliability of the EL element is improved.

After the airtightness is raised by the treatment such as packaging, a connector (Flexible Printed Circuit: FPC) for connecting a terminal extended from the element or the circuit formed on the substrate to an external signal terminal is attached so that a product is completed.

Embodiment 4

Figure 11A:
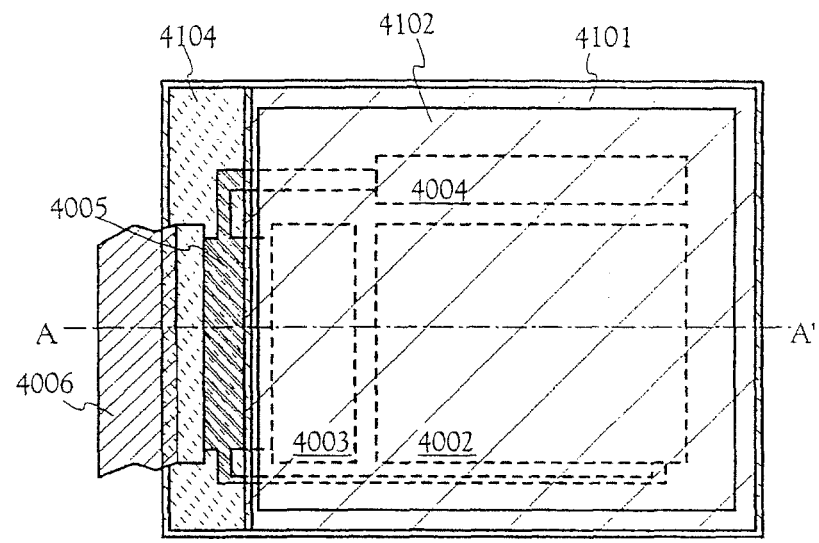
FIGS. 11A and 11B are a top view and a sectional view of a light-emitting device of Embodiment 4.

In this embodiment, an example in which a light-emitting device is fabricated by using the present invention will be described. FIG. 11A is a top view of the light-emitting device of the present invention, and FIG. 11B is a sectional view thereof.

In FIG. 11A, reference numeral 4001 designates a substrate; 4002, a pixel portion; 4003, a source signal line driving circuit; and 4004, a gate signal line driving circuit. The respective driving circuits lead to an FPC (Flexible Printed Circuit) 4006 through a wiring line 4005 and are connected to an external instrument.

At this time, a first seal member 4101, a cover member 4102, a filler member 4103, and a second seal member 4104 are provided so as to surround the pixel portion 4002, the source signal line driving circuit 4003, and the gate signal line driving circuit 4004.

Figure 11B:
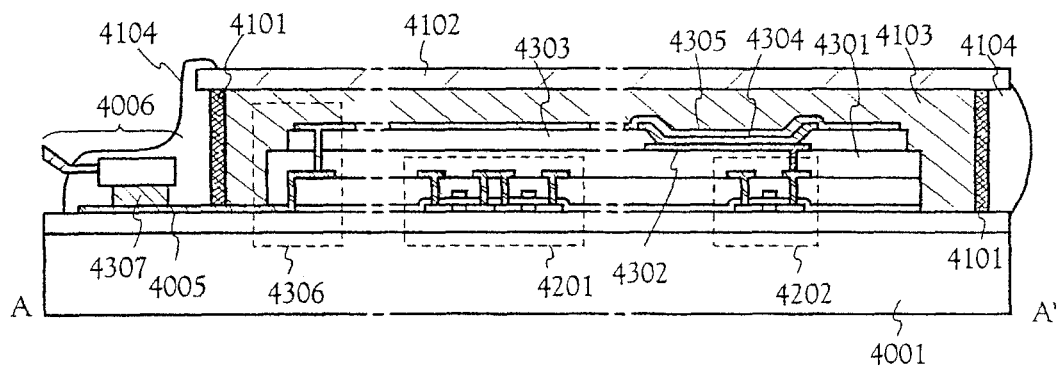

FIG. 11B is a sectional view taken along line A-A' of FIG. 11A, and a driving TFT (here, an re-channel TFT and a p-channel TFT are shown) 4201 included in the source signal line driving circuit 4003 and a current controlling TFT (TFT for controlling current to an EL element) 4202 included in the pixel portion 4002 are formed on the substrate 4001. Note that in FIG. 11B, a switching TFT is not shown for simplification of the explanation.

In this embodiment, the driving TFT 4201 and the current controlling TFT 4202 are formed by using a well-known fabricating method. Besides, a holding capacitance (not shown) connected to a gate electrode of the current controlling TFT 4202 is provided in the pixel portion 4002.

An interlayer insulating film (flattening film) 4301 made of a resin material is formed on the driving TFT 4201 and the switching TFT 4202, and a pixel electrode (anode) 4302 electrically connected to a drain region of the pixel TFT 4202 is formed thereon. As the pixel electrode 4302, a transparent conductive film having a large work function is used. As the transparent conductive film, a compound of indium oxide and tin oxide, a compound of indium oxide and zinc oxide, zinc oxide, tin oxide, or indium oxide can be used. The transparent conductive film added with gallium may be used.

Then, an insulating film 4303 is formed on the pixel electrode 4302, and an opening portion is formed in the insulating film 4303 on the pixel electrode 4302. At this opening portion, an EL (electroluminescence) layer 4304 is formed on the pixel electrode 4302. As the EL layer 4304, a well-known organic EL material or an inorganic EL material can be used. Although the organic EL material includes a low molecular (monomer) material and a high molecular (polymer) material, either may be used.

As a method of forming the EL layer 4304, a well-known evaporation technique or coating technique may be used. The structure of the EL layer may be made a laminate structure by freely combining a hole injecting layer, a hole transporting layer, a light-emitting layer, an electron transporting layer, and an electron injecting layer or a single layer structure.

A cathode 4305 made of a conductive film (typically, a conductive film containing aluminum, copper or silver as its main ingredient, or a laminate film of those and another conductive film) having a light shielding property is formed on the EL layer 4304. It is desirable that moisture and oxygen existing at the interface between the cathode 4305 and the EL layer 4304 are removed to the utmost degree. Accordingly, it is necessary to make such contrivance that both are continuously formed in vacuum, or the EL layer 4304 is formed in a nitrogen or rare gas atmosphere, and the cathode 4305 is formed while the layer is not put into contact with oxygen and moisture. In this embodiment, a film forming apparatus of a multichamber system (cluster tool system) is used so that the film formation as described above is made possible.

The cathode 4305 is electrically connected to the wiring line 4005 in a region designated by 4306. The wiring line 4005 is a wiring line for giving a predetermined voltage to the cathode 4305, and is electrically connected to the FPC 4006 through an anisotropic conductive film 4307.

In the manner as described above, an EL element constituted by the pixel electrode (anode) 4302, the EL layer 4304, and the cathode 4305 is formed. This EL element is surrounded by the cover member 4102 bonded to the substrate 4001 by the first seal member 4101 and the second seal member 4104 and is sealed by the filler member 4103.

As the cover member 4102, a glass member, a metal member (typically a stainless member), a ceramic member, or a plastic member (including a plastic film as well) can be used. As the plastic member, an FRP (Fiberglass-Reinforced Plastics) plate, a PVF (polyvinyl fluoride) film, a Mylar film, a polyester film, or an acrylic resin film can be used. Besides, a sheet having a structure in which an aluminum foil is sandwiched between PVF films or Mylar films can also be used.

However, in the case where the radiation of light from the EL element is directed toward the side of the cover member, the cover member must be transparent. In that case, a transparent material such as a glass plate, a plastic plate, a polyester film or an acryl film is used.

As the filler member 4103, an ultraviolet ray curing resin or a thermosetting resin can be used, and PVC (polyvinyl chloride), acryl, polyimide, epoxy resin, silicone resin, PVB (polyvinyl butyral) or EVA (ethylene-vinyl acetate) can be used. If a hygroscopic material (preferably barium oxide) or a material capable of adsorbing oxygen is provided in the inside of this filler member 4103, deterioration of the EL element can be suppressed.

A space may be included in the filler member 4103. At this time, if the spacer is formed of barium oxide, it is possible to make the spacer itself have a hygroscopic property.

Besides, in the case where the spacer is provided, as a buffer layer for relieving stress from the spacer, it is also effective to provide a resin film on the cathode 4305.

The wiring line 4005 is electrically connected to the FPC 4006 through the anisotropic conductive film 4307. The wiring line 4005 connected to the pixel portion 4002, the source signal line driving circuit 4003, and the gate signal line driving circuit 4004 are electrically connected to an outside instrument through the FPC 4006.

Besides, in this embodiment, a second seal member 4104 is provided so as to cover an exposed portion of the first seal member 4101 and a part of the FPC 4006, and a structure to thoroughly shut off the EL element from the outer air is adopted.

Embodiment 5

Figure 12A:
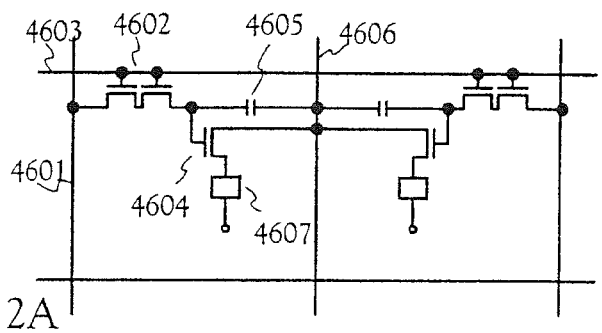
FIGS. 12A to 12C are circuit diagrams of pixels of light-emitting devices of Embodiment 5.
Figure 12B:
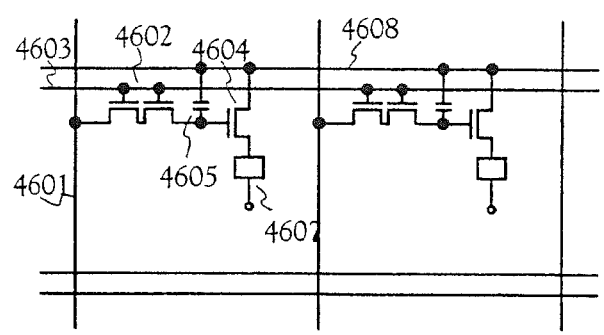
Figure 12C:
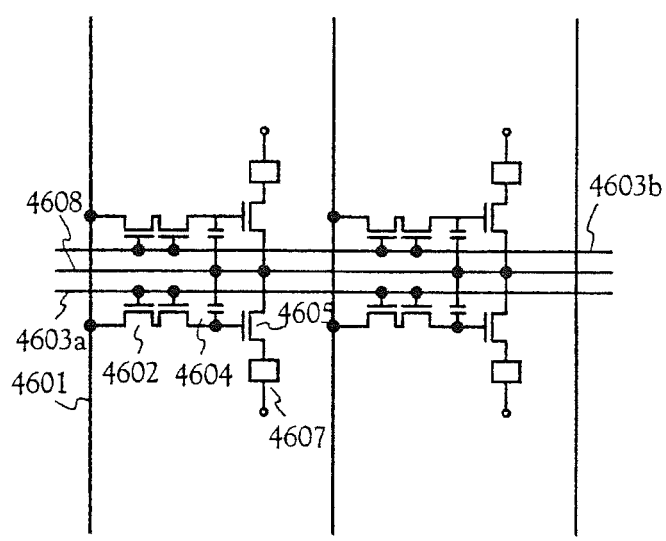

In this embodiment, examples of pixel structures which can be used for the pixel portion of the light-emitting device set forth in the embodiments 1 to 4 are shown in FIGS. 12A to 12C. In this embodiment, reference numeral 4601 designates a source signal line; 4602, a switching TFT; 4603, a gate signal line; 4604, a current controlling TFT; 4605, a capacitor; 4606 and 4608, power supply lines; and 4607, an EL element.

FIG. 12A is a circuit diagram in a case where two pixels including the same gate signal line own the power supply line 4606 jointly. That is, the feature is that the two pixels are formed to be axially symmetrical with respect to the power supply line 4606. In this case, since the number of power supply lines can be decreased, the pixel portion can be made highly fine.

FIG. 12B is a circuit diagram in a case where the power supply line 4608 is provided in parallel with the gate signal line 4603. Note that although FIG. 12B shows the structure in which the power supply line 4608 does not overlap with the gate signal line 4603, if both are wiring lines formed in different layers, they can also be formed so as to overlap with each other through an insulating film. In this case, since an occupied area can be jointly owned by the power supply line 4608 and the gate signal line 4603, the pixel portion can be made highly fine.

FIG. 12C has a feature that the power supply line 4608 is provided in parallel with gate signal lines 4603 (4603a, 4603b) similarly to the structure of FIG. 12B, and further, two pixels are formed to be axially symmetrical with respect to the power supply line 4608. It is also effective that the power supply line 4608 is provided to overlap with one of the gate signal lines 4603a and 4603b. In this case, since the number of power supply lines can be decreased, the pixel portion can be further made highly fine.

Embodiment 6

Figure 13:
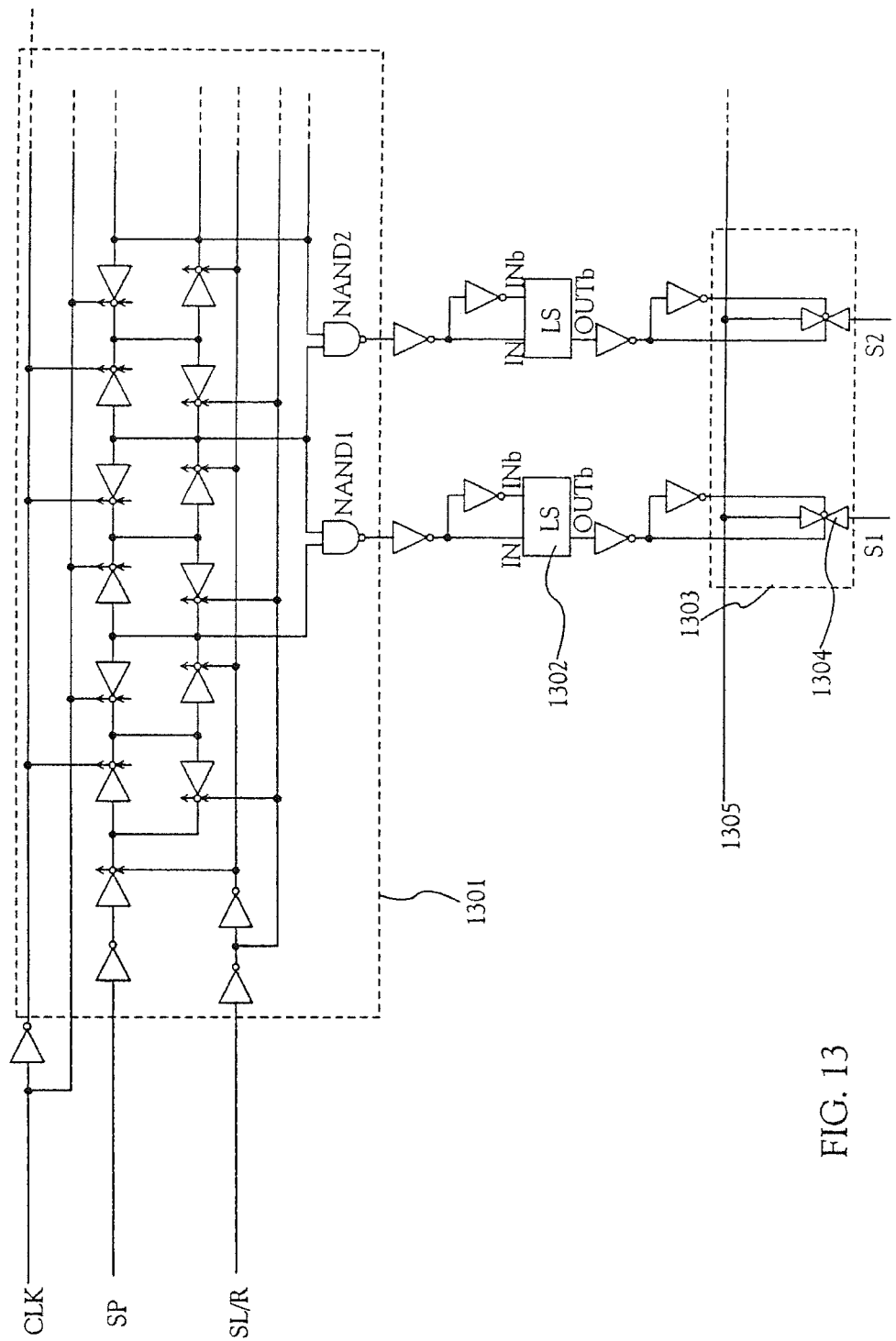
FIG. 13 is a circuit diagram of a source signal line driving circuit of Embodiment 6.

In this embodiment, a detailed circuit structure of a source signal line driving circuit of a light-emitting device of the present invention will be described with reference to FIG. 13.

Reference numeral 1301 designates a shift register; 1302, a level shift; 1303, a sampling circuit; 1304, an analog switch; and 1305, a video signal.

A clock signal (CLK) as a panel control signal, and a start pulse signal (SP) are inputted to the shift register 1301. A sampling signal for sampling a video signal is outputted from the shift register 1301. The outputted sampling signal is inputted to the level shift 1302.

Figure 14A:
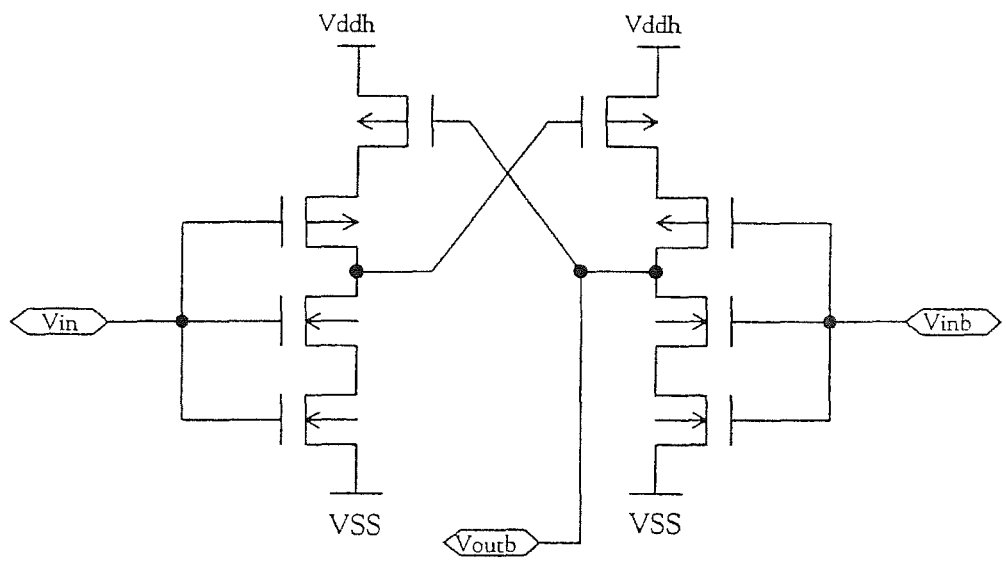
FIGS. 14A and 14B are equivalent circuit diagrams of a level shift and an analog switch of Embodiment 6.

The amplitude of the potential of the clock signal inputted to the level shift 1302 is made large. FIG. 14A is an equivalent circuit diagram of the level shift 1302. Reference characters Vin and Vinb designate input terminals, and Vinb means that a signal having a potential equal to an inversion of a potential of a signal inputted to Vin is inputted. Reference character Vddh designates a voltage of a power source at a high voltage side, and Vss designates a voltage of a power source at a low voltage side. Reference character Voutb designates an output terminal, and the level shift 1302 is designed such that a signal obtained by boosting and inverting a signal inputted to Vin is outputted from Voutb. That is, when Hi is inputted to Vin, a signal corresponding to Vss is outputted from Voutb, and when Lo is inputted, a signal corresponding to Vddh is outputted from Vout.

Note that in this embodiment, although the level shift having the structure shown in FIG. 14A is used, the present invention is not limited to this. In the light-emitting device of the present invention, a level shift having a well-known structure can be used.

The sampling signal outputted from the level shift 1302 is inputted to the sampling circuit 1303. At the same time, the video signal is inputted to the sampling circuit 1303 through the video signal line 1305.

Figure 14B:
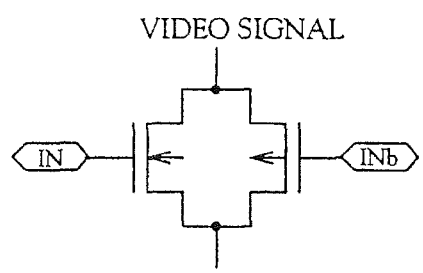

The sampling circuit 1303 includes the analog switch 1304. FIG. 14B is an equivalent circuit diagram of the analog switch 1304 used in this embodiment. A voltage of the sampling signal inputted to the sampling circuit 1303 is applied to a gate electrode of a TFT constituting the analog switch 1304 of the sampling circuit 1303. By this, a channel is formed in the TFT constituting the analog switch 1304, and a current flows from a source to a drain. Thus, the video signal is sampled and is supplied to a source of a pixel TFT through a source signal line (S1, S2).

Note that although the analog switch having the structure shown in FIG. 14B is used in this embodiment, the present invention is not limited to this. In the light-emitting device of the present invention, an analog switch having a well-known structure can be used. Besides, in FIG. 13, although only two signal lines S1 and S2 are shown for simplification of the explanation, the number of source signal lines of this embodiment is not limited to this.

Note that this embodiment can be carried out in combination with all embodiments of the present specification.

Embodiment 7

Figure 15:
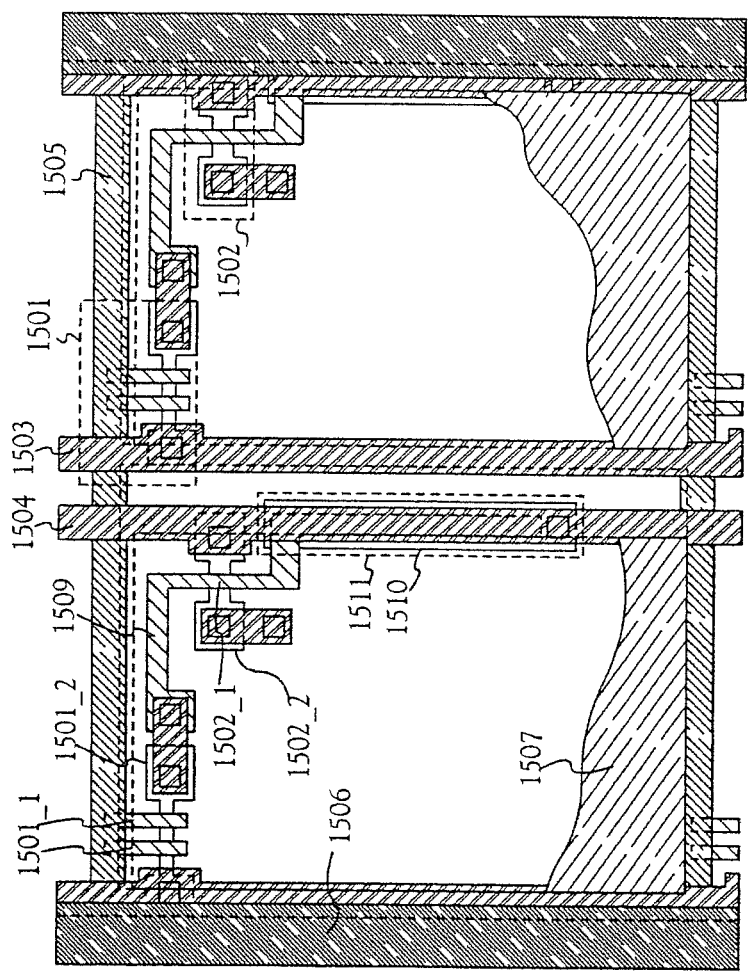
FIG. 15 is a top view of a pixel of Embodiment 7.

In this embodiment, an upper view of a pixel of a light-emitting device of the present invention is shown in FIG. 15 as an example.

Reference numeral 1501 designates a switching TFT, which includes a gate electrode 1501_1 and an active layer 1501_2. Reference numeral 1502 designates a current controlling TFT, which includes an active layer 1502_2 and a gate electrode 1502_2 as a part of a wiring line 1509. Note that in this embodiment, although the switching TFT 1501 is made to have a double gate structure, and the current controlling TFT 1502 is made to have a single gate structure, the present invention is not limited to this constitution. The switching TFT 1501 and the current controlling TFT 1502 may have a single gate structure, or may have a multigate structure such as a double gate structure or a triple gate structure.

Reference numeral 1503 designates a source signal line; 1504, a power supply line; and 1505, a gate signal line. The source signal line 1503 is connected to the active layer 1501_2 of the switching TFT 1501 through a contact hole.

The power supply line 1504 is connected to a source region of the active layer 1502_2 of the current controlling TFT 1502 through a contact hole. The gate signal line 1505 is connected to the gate electrode 1501_1 of the switching TFT 1501.

The wiring line 1509 including the gate electrode 1502_1 of the current controlling TFT 1502 overlaps with the power supply line 1504 through an insulating film in a region indicated by 1511. At this time, a holding capacitance (capacitor) is formed in the region indicated by 1511. The holding capacitance 1511 is formed of a semiconductor film 1510 electrically connected to the power supply line 1504, an insulating film (not shown) of the same layer as the gate insulating film, and the wiring line 1509. A capacitance formed of the wiring line 1509, the same layer (not shown) as the first interlayer insulating film, and the power supply line 1504 can also be used as a holding capacitance. This holding capacitance 1511 functions as a capacitor for holding voltage applied to the gate electrode 1502_1 of the current controlling TFT 1502. The source region of the current controlling TFT 1502 is connected to the power supply line (power source line) 1504 and a constant voltage is always applied.

A first passivation film (not shown) is provided on the switching TFT 1501 and the current controlling TFT 1502, and a flattening film (third interlayer insulating film) (not shown) made of a resin insulating film is formed thereon. It is very important to flatten a stepped portion due to a TFT by using the flattening film Since a later formed EL layer (not shown) is very thin, there is a case where poor light emission occurs due to the existence of the stepped portion. Accordingly, it is desirable to make flattening before a pixel electrode 1507 is formed so that the EL layer can be formed on the flattest possible surface.

Reference numeral 1507 designates the pixel electrode (a cathode of an EL element) made of a conductive film having high reflectivity, and is electrically connected to the drain region of the current controlling TFT 1502 through a contact hole provided in the first passivation film and the flattening film. As the pixel electrode 1507, it is desirable to use a low resistance conductive film such as an aluminum alloy film, a copper alloy film or a silver alloy film, or a laminate film of those. Of course, a laminate structure with another conductive film may be adopted.

Next, an organic resin film is formed on the pixel electrode 1507 and the flattening film, and the organic resin film is patterned, so that a bank 1506 is formed. The bank 1506 is provided to separate light-emitting layers or EL layers of adjacent pixels. The light-emitting layer (not shown) is formed in a groove (corresponding to a pixel) formed by the bank 1506. Note that in FIG. 15, although the bank is partially omitted in order to clarify the position of the holding capacitance 1511, it is provided between pixels so as to cover part of the power supply line 1503 and the source signal line 1504. Besides, although only two pixels are shown here, light-emitting layers corresponding to the respective colors of R (red), G (green) and B (blue) may be individually formed. As an organic EL material used for the light-emitting layer, a Π-conjugated polymer material is used. As a typical polymer material, polyparaphenylene vinylene (PPV), polyvinylcarbazole (PVK), polyfluorene or the like is named.

Although there are various types as the PPV organic EL material, for example, a material as disclosed in H. Shenk, H. Becker, O. Gelsen, E. Kluge, W. Kreuder, and H. Spreitzer, "Polymers for Light-emitting Diodes", Euro Display, Proceedings, 1999, p. 33-37 or Japanese Patent Laid-Open No. Hei 10-92576 may be used.

Although this embodiment shows the example in which the polymer material is used as the light-emitting layer, a low molecular organic EL material may be used. Besides, as a charge transporting layer or a charge injecting layer, an inorganic material such as silicon carbide can also be used. As the organic EL material or inorganic material, a well-known material can be used.

This embodiment adopts the EL layer of a laminate structure in which a hole injecting layer (not shown) made of PEDOT (polythiophene) or PAni (polyaniline) is provided on the light-emitting layer. An anode (not shown) made of a transparent conductive film is provided on the hole injecting layer. In the case of this embodiment, since light generated in the light-emitting layer is radiated toward the upper surface side (toward the upper portion of the TFT), the anode must be translucent. Although a compound of indium oxide and tin oxide or a compound of indium oxide and zinc oxide can be used as the transparent conductive film, since the film is formed after the light-emitting layer and the hole injecting layer having low heat resistance are formed, it is desirable to use a material by which the film can be formed at the lowest possible temperature.

At the point of time when the anode is formed, the EL element is completed. Note that the EL element here indicates a capacitor formed of the pixel electrode (cathode) 1507, the light-emitting layer, the hole injecting layer and the anode. As shown in FIG. 15, since the pixel electrode 1507 is almost coincident with the area of a pixel, the whole pixel functions as the EL element. Thus, a use coefficient of light emission is very high, and a bright image display becomes possible.

As described above, the EL display panel of the present invention includes the pixel portion made of the pixel having the structure as shown in FIG. 15, and includes the switching TFT having an adequately low off current value and the current controlling TFT proof against hot carrier injection. Accordingly, it is possible to obtain the EL display panel having high reliability and enabling an excellent image display.

Note that the structure of this embodiment can be freely combined with the embodiments 1, 2, 6 and 8 and can be carried out.

Embodiment 8

In this embodiment, an example of a film forming apparatus used when an EL layer is formed in the above respective embodiments will be described.

Figure 19:
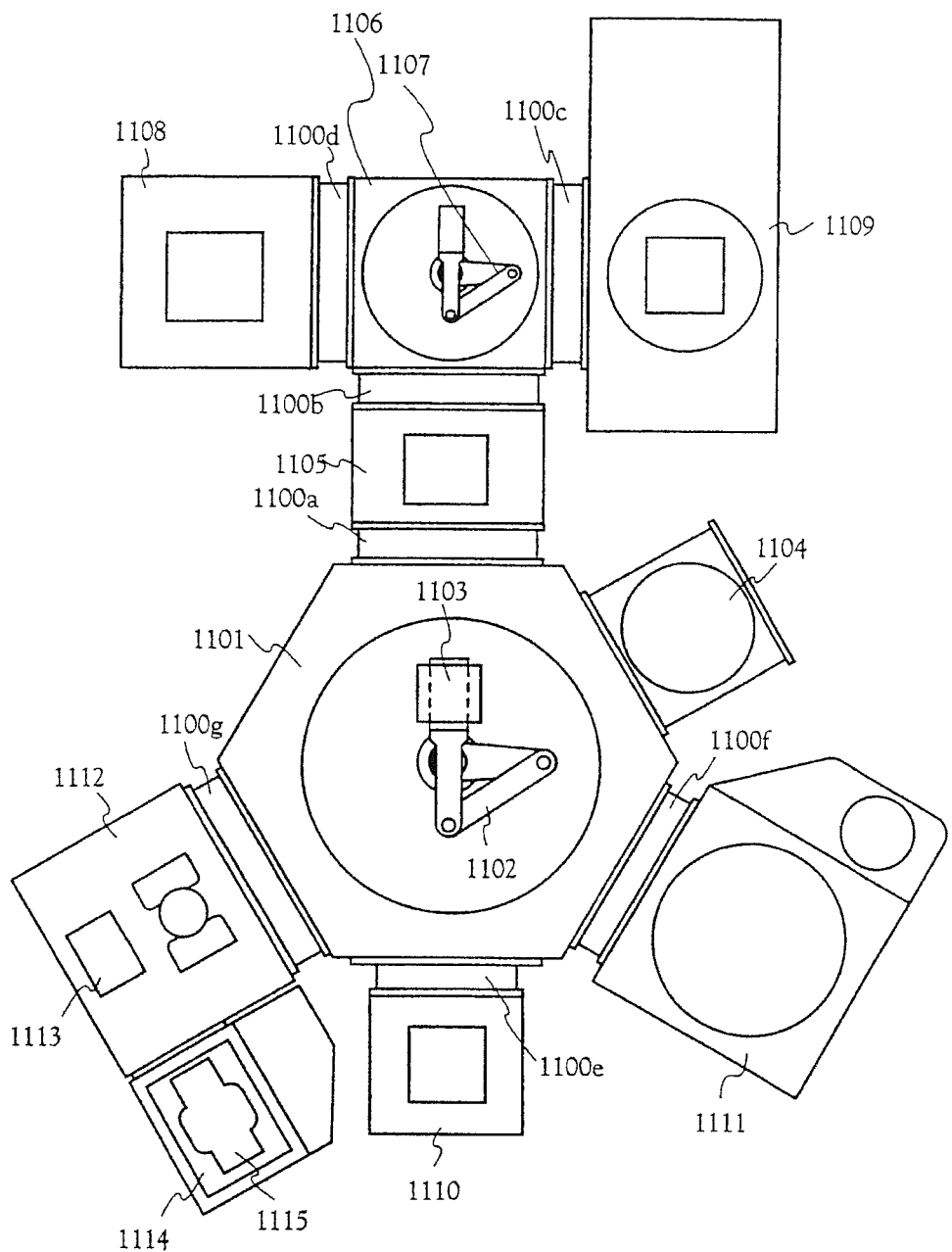
FIG. 19 is a view of a spin coater used when a light-emitting device of Embodiment 8 is fabricated.

The film forming apparatus of this embodiment will be described with reference to FIG. 19. In FIG. 19, reference numeral 1101 designates a conveying chamber (A), and the conveying chamber (A) 1101 is provided with a conveying chamber mechanism (A) 1102, in which a substrate 1103 is conveyed. The conveying chamber (A) 1101 is made to have a reduced pressure atmosphere, and is shut off from respective processing chambers by gates. Delivery of the substrate to the respective processing chambers is performed by the conveying chamber mechanism (A) when the gate is opened. In order to decrease the pressure in the conveying chamber (A) 1101, although an exhaust pump such as an oil rotary pump, a mechanical booster turbo pump, a turbo molecular pump, or a cryopump can be used, the cryopump effective in removing moisture is preferable.

In the film forming apparatus of FIG. 19, an exhaust port 1104 is provided at a side of the conveying chamber (A)

1101, and the exhaust pump is provided under that. When such structure is adopted, there is a merit that the maintenance of the exhaust pump becomes easy.

Hereinafter, the respective processing chambers will be described. Note that since the conveying chamber (A) 1101 comes to have a reduced atmosphere, all processing chambers directly coupled with the conveying chamber (A) 1101 are provided with exhaust pumps (not shown). As the exhaust pump, a mechanical booster pump, a turbo molecular pump, or a cryopump is used.

First, reference numeral 1105 designates a stock chamber in which setting of the substrate is carried out and which is also called a load lock chamber. The stock chamber 1105 is shut off from the conveying chamber (A) 1101 by a gate 1100a, and a carrier (not shown) on which the substrate 1103 is set is disposed here. Note that the stock chamber 1105 may be divided into a portion for use in carrying a substrate in and a portion for use in carrying a substrate out. Besides, the stock chamber 1105 is provided with the foregoing exhaust pump and a purge line for introducing a high purity nitrogen gas or rare gas.

In this embodiment, the substrate 1103 is set on the carrier while its element formation surface is made to face downward. This is for facilitating a face down system (also called a deposit up system) when vapor phase film formation (film formation by sputter or evaporation) is later carried out. The face down system is a system in which film formation is carried out in a state where an element formation surface of a substrate faces downward, and according to this system, adhesion of dust or the like can be suppressed.

Next, reference numeral 1106 designates a conveying chamber (B) which is coupled with the stock chamber 1105 through a gate 1100b and includes a conveying chamber mechanism (B) 1107. Reference numeral 1108 designates a baking chamber (bake chamber) which is coupled with the conveying chamber (B) 1106 through a gate 1100d. The baking chamber 1108 includes a mechanism for inverting the top and bottom of the surface of the substrate. That is, the substrate conveyed in the face down system is once changed to the face up system here. This is for enabling a next processing in a spin coater 1109 to be carried out in the face up system. On the contrary, the substrate which has been subjected to the processing in the spin coater 1109 is again returned to the baking chamber 1108 and is baked, and the top and bottom is again inverted to the face down system, and the substrate is returned to the stock chamber 1105.

The film formation chamber 1109 provided with the spin coater is coupled with the conveying chamber (B) 1106 through a gate 1100c. The film formation chamber 1109 provided with the spin coater is a film formation chamber in which a solution containing an EL material is coated on the substrate so that a film containing the EL material is formed, and in this embodiment, a film of a high molecular (polymer) organic EL material is formed in the film formation chamber 1109 provided with the spin coater. Note that the EL material to be formed into a film includes one used for not only a light-emitting layer but also a charge injecting layer or a charge transporting layer. Besides, any well-known high molecular organic EL material may be used.

As a typical organic EL material which becomes the light-emitting layer, a PPV (polyparaphenylene vinylene) derivative, a PVK (polyvinylcarbazole) derivative, or a polyfluorene derivative is named. This is also called a H-conjugated polymer. As the charge injecting layer, PEDOT (polythiophene) or PAni (polyaniline) is named.

Note that in this embodiment, although the film formation chamber using the spin coater is shown, it is not necessary to make limitation to the spin coater, but the film formation chamber may use a dispenser, printing, or ink jet instead of the spin coater. Further, as shown in FIG. 19, a preprocessing chamber 1110, a gas phase film formation chamber 1111, a sealing chamber 1112, an ultraviolet light irradiation mechanism 1113, a delivery chamber 1114, a conveying chamber mechanism (c) 1115 and gates 1100f, 1100e and 1100g can be equipped.

Besides, the film forming apparatus of this embodiment can be used when the EL layer is formed in the structure in which any structures of the embodiments 1 to 7 are freely combined.

Embodiment 9

In this embodiment, in a light-emitting device using an organic EL material in which emission brightness of red, blue and green are different, W/L of a current controlling TFT of a pixel for displaying a color with low emission brightness is made larger than W/L of a current controlling TFT of a pixel for displaying a color with relatively high emission brightness. By the above structure, a drain current of the current controlling TFT of the pixel for displaying the color with the low emission brightness is made higher than a drain current of the current controlling TFT of the pixel for displaying the color with the relatively high emission brightness.

Thus, in the light-emitting device using the organic EL material in which the emission brightness of red, blue and green are different, the amount of current flowing through an EL element for displaying the color with the low emission brightness becomes larger than the amount of current flowing through an EL element for displaying the color with the relatively high emission brightness. By this, it is possible to display an image having an excellent balance among red, blue and green emission brightness.

Note that this embodiment can be used in combination with any other embodiments.

Embodiment 10

Figure 20:
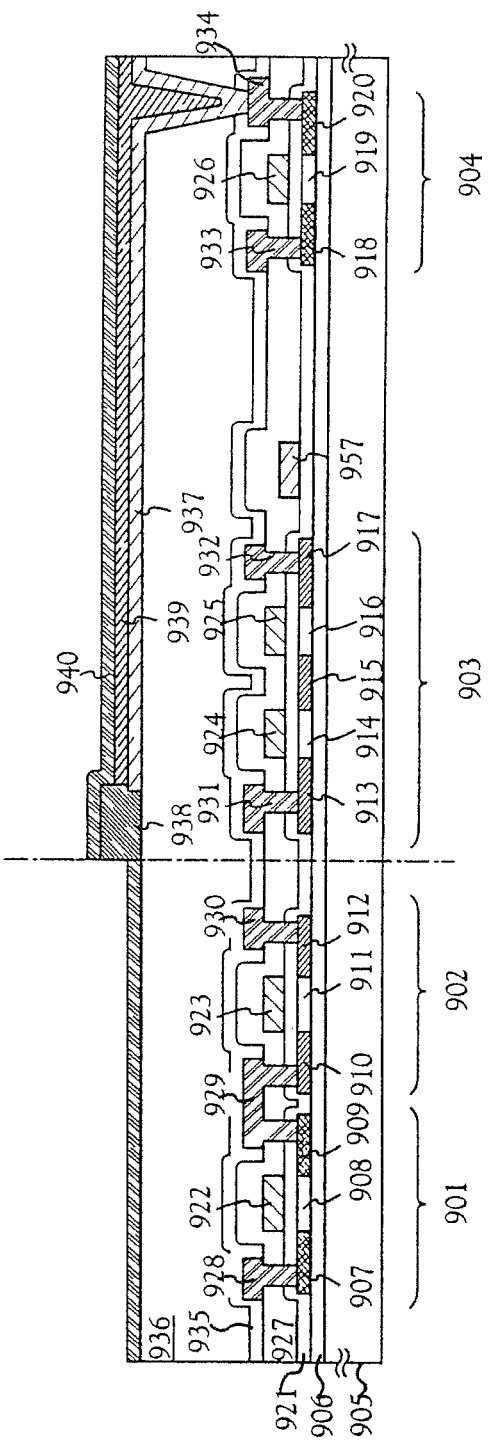
FIG. 20 is a sectional detailed view of a light-emitting device of Embodiment 10.

In this embodiment, an example of a structure of a light-emitting device of the present invention will be described with reference to FIG. 20.

An insulating film 906 is formed on a substrate 905, and there are formed thereon a p-channel TFT 901 and an n-channel TFT 902 included in a CMOS circuit of a driving circuit (source signal line driving circuit or gate signal line driving circuit), and a switching TFT 903 and a current controlling TFT 904 included in a pixel portion.

The p-channel TFT 901 included in the driving circuit includes a source region 907, a drain region 909, and a channel forming region 908. Further, the p-channel TFT 901 includes the gate insulating film 906 on the channel forming region 908, and a gate electrode 922 on the gate insulating film 906. A first interlayer insulating film 927 is provided to cover the gate insulating film 906 and the gate electrode 922. Further, the p-channel TFT 901 includes a source wiring line 928 connected to the source region 907 and a drain wiring line 929 connected to the drain region 909, through contact holes provided in the gate insulating film 906 and the first interlayer insulating film 927.

The n-channel TFT 902 included in the driving circuit includes a source region 912, a drain region 910, and a channel forming region 911. Further, the n-channel TFT 902 includes the gate insulating film 906 on the channel forming region 911, and a gate electrode 923 on the gate insulating film 906. The first interlayer insulating film 927 is provided to cover the gate insulating film 906 and the gate electrode 923. Further, the n-channel TFT 902 includes a source wiring line 930 connected to the source region 912 and a drain wiring line 929 connected to the drain region 910, through contact holes provided in the gate insulating film 906 and the first interlayer insulating film 927.

The switching TFT 903 included in the pixel portion has a double gate structure. Note that in this embodiment, although the switching TFT 903 has the double gate structure, it may have a single gate structure or another multigate structure. The switching TFT 903 includes a source region 913, a drain region 917, channel forming regions 914 and 916, and an impurity addition region 915. Further, the switching TFT 903 includes the gate insulating film 906 on the channel forming regions 914 and 916, and gate electrodes 924 and 925 on the gate insulating film 906. The first interlayer insulating film 927 is provided to cover the gate insulating film 906 and the gate electrodes 924 and 925. Further, the switching TFT 903 includes a source wiring line (source signal line) 931 connected to the source region 913 and a drain wiring line 932 connected to the drain region 917, through contact holes provided in the gate insulating film 906 and the first interlayer insulating film 927.

Reference numeral 957 designates a gate wiring line (gate signal line), which electrically connects the gate electrode 924 of the switching TFT 903 to the gate electrode 925. The gate wiring line 957 may be formed of the same material as the gate electrodes 924 and 925 of the switching TFT 903 or may be formed of a different material. By forming the gate electrodes 924 and 925 from a material easy to precisely work, and forming the gate wiring line 957 from a material having resistance lower than the material forming the gate electrodes 924 and 925, it becomes possible to form a light-emitting device having higher definition and a large screen.

The current controlling TFT 904 included in the pixel portion has a single gate structure. Note that in this embodiment, although the current controlling TFT 904 has the single gate structure, it may have a double gate structure or another multigate structure. The current controlling TFT 904 includes a source region 918, a drain region 920, and a channel forming region 919. Further, the current controlling TFT 904 includes the gate insulating film 906 on the channel forming regions 919, and a gate electrode 926 on the gate insulating film 906. The first interlayer insulating film 927 is provided to cover the gate insulating film 906 and the gate electrode 926. Further, the current controlling TFT 904 includes a source wiring line 933 connected to the source region 918 and a drain wiring line 934 connected to the drain region 920, through contact holes provided in the gate insulating film 906 and the first interlayer insulating film 927.

A second interlayer insulating film 935 is formed to cover the first interlayer insulating film 927, the source wiring lines 928, 930, 931, and 933, and the drain wiring lines 929, 932, and 934. A third interlayer insulating film (flattening film) 936 made of an organic resin is formed on the second interlayer insulating film 935.

A pixel electrode 937 connected to the drain wiring line 934 of the current controlling TFT 904 through a contact hole formed in the second interlayer insulating film 935 and the third interlayer insulating film 936 is formed on the third interlayer insulating film 936. In this embodiment, it is desirable that the pixel electrode 937 is formed of a transparent electrode, for example, ITO.

Besides, a bank 938 for separating EL layers or light-emitting layers between pixels is provided on the source wiring line 931. In this embodiment, although the bank 938 is provided on the source wiring line 931, the present invention is not limited to this. The bank 938 may be provided on the gate wiring line 957.

An EL layer 939 is provided on the pixel electrode 937. The EL layer can be formed using a well-known material. A cathode 940 is provided on the EL layer 939. The cathode 940 can be formed of a well-known material, and it was formed using MgAg in this embodiment.

It is desirable that the EL layer 939 and the cathodes 940 are continuously formed in the same chamber without opening to the air.

Since the light-emitting device having the structure of this embodiment does not includes an LDD region, the operation speed is relatively high.

In the case where a voltage applied to the EL element becomes 10 V or less, preferably 5 V or less, since deterioration of the TFT due to the hot carrier effect does not become a serious problem, the structure including no LDD regions set forth in this embodiment is effective in suppressing the number of fabricating steps.

Embodiment 11

In this embodiment, a description will be given of an example in the case where the present invention is applied to an actual light-emitting device using the above expressions 8 and 11 and which is different from the former embodiment.

In this embodiment, a light-emitting device having a resolution of QVGA of 320×240 and a size of 4 inches will be exemplified.

A pixel size of the 4-inch QVGA light-emitting device is about 84 μm×252 μm. When an attempt to obtain constant brightness is made, the amount of current per unit area flowing through an EL element is determined. In this embodiment, it is made 3 mA/cm² per unit area. Thus, a drain current Id of a current controlling TFT included in each of pixels is expressed by the following expression 29.

$$Id = 3*(84*10^{-4})*(252*10^{-4}) = 6.35*10^{-7} \text{ A} \quad \text{[Expression 29]}$$

The above expression 29 indicates a value of the drain current Id of the current controlling TFT when the opening ratio of the light-emitting device is made 100%. Actually, in almost all cases, the opening ratio of the light-emitting device is not 100%. As the opening ratio of the light-emitting device becomes small, the value of the actually required drain current Id becomes large. For example, if the opening ratio of the light-emitting device of this embodiment is 30%, the value of the actually required drain current Id is obtained by the following equation 30.

$$Id = 6.35*10^{-7}/0.3 = 2.11 \text{ μA} \quad \text{[Expression 30]}$$

Since the light-emitting device used in this embodiment uses a bottom gate type current controlling TFT, when a mobility of the current controlling TFT is μ=50 (m2/V·sec) and a capacitance value of the gate capacitance is $C_0=2.4 \times 10^{-8}$ (F/cm²), a constant A is obtained from expression 31.

$$A = \frac{2*Id}{\mu * C_0} = 3.52(A) \quad \text{[Expression 31]}$$

In this embodiment, a difference between emission brightness of the respective pixels is restricted within a range of, for example, ±5%. When a gate voltage $Vgs_{(max)}$ immediately before the TFT is broken is made 25 V, and a value of a threshold voltage Vth is made 0 V, the following expressions 32 and 33 are obtained from the expressions 8 and 11.

$$|\Delta Vth| \leq 0.046 * \sqrt{L/W} \qquad \text{[Expression 32]}$$

$$2.26*10^{-3} \leq \frac{W}{L} \leq \frac{2.14*10^{-3}}{\Delta Vth^2} \qquad \text{[Expression 33]}$$

In the light-emitting device of the present invention, the values of ΔVth and W/L are determined within the range where the above expression 32 or 33 is satisfied, and the fluctuation of the drain current Id can be suppressed to the range of ±5%.

It is generally desirable that the fluctuation ΔVth of the threshold value of the current controlling TFT is 0.1 V or less.

It is assumed that the fluctuation ΔVth of the threshold voltage is ΔVth 0.1 V by a fabricating process of the TFT. When ΔVth=0.1 V is substituted in the expression 33, the following expression 34 is obtained.

$$2.26*10^{-3} \leq \frac{W}{L} \leq 0.214 \qquad \text{[Expression 34]}$$

If the ratio W/L of the channel length L to the channel width W is determined so that the expression 34 is satisfied, the fluctuation of the drain current Id can be suppressed to the range of ±5%.

According to the above structure, in the light-emitting device of the present invention, the number of thin film transistors provided in each of pixels is made two to prevent a drop in the opening ratio, and it becomes possible to suppress uneven brightness due to fluctuation in the threshold voltage of current controlling TFTs included in the respective pixels.

Note that in this embodiment, although the description has been given of the example in which the fluctuation of the drain current Id is suppressed to the range of ±5%, the present invention is not limited to this numerical value.

Embodiment 12

In the present invention, external luminous quantum efficiency can be remarkably improved by using an EL material which can use phosphorescence from a triplet exciton for light emission. By this, it becomes possible to realize low power consumption, long lifetime, and light weight of an EL element.

Here, there is a report in which the triplet exciton is used and the external luminous quantum efficiency is improved. (T. Tsutsui, C. Adachi, S. Saito, Photochemical Processes in Organized Molecular Systems, ed. K. Honda, (Elsevier Sci. Pub., Tokyo, 1991) p. 437.)

A molecular formula of an EL material (coumarin pigment) reported in the above paper is as follows:

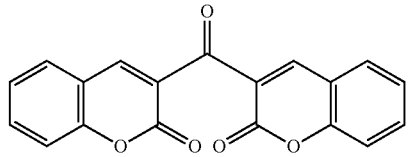

[Chemical Formula 1]

(M. A. Baldo, D. F. O'Brien, Y. You, A. Shoustikov, S. Sibley, M. E. Thompson, S. R. Forrest, Nature 395 (1988) p. 151.)

A molecular formula of an EL material (Pt complex) reported in the above paper is as follows:

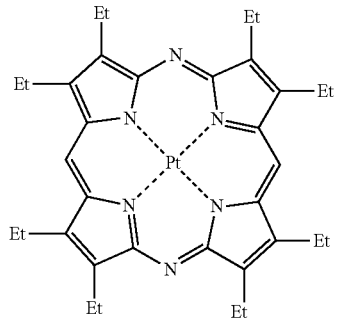

[Chemical Formula 2]

(M. A. Baldo, S. Lamansky, P. E. Burrrows, M. E. Thompson, S. R. Forrest, Appl. Phys. Lett., 75 (1999) p. 4.) (T. Tsutsui, M. J. Yang, M. Yahiro, K. Nakamura, T. Watanabe, T. Tusji, Y. Fukuda, T. Wakimoto, S. Mayaguchi, Jpn. Appl. Phys., 38 (12B) (1999) L1502.)

A molecular formula of an EL material (Ir complex) reported in the above paper is as follows:

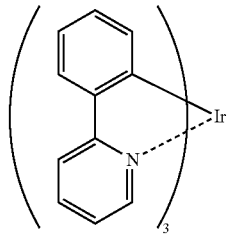

[Chemical Formula 3]

As described above, if phosphorescence emission from the triplet exciton can be used, in principle, it becomes possible to realize the external luminous quantum efficiency 3 to 4 times as high as the case of using fluorescence from a single exciton.

Note that the structure of this embodiment can be freely combined with any structure of the embodiments 1 to 11 and can be carried out.

Embodiment 13

A light-emitting device has superior visibility in bright locations in comparison to a liquid crystal display device because it is of a self-emitting type, and moreover viewing angle is wide. Accordingly, it can be used as a display portion for various electronic apparatuses. For example, it is appropriate to use the light-emitting device of the present invention as a display portion of an EL display (a display incorporating the light-emitting device in its casing) having a diagonal equal to 30 inches or greater (typically equal to 40 inches or greater) for appreciation of TV broadcasts by a large screen.

Note that all displays exhibiting (displaying) information such as a personal computer display, a TV broadcast reception display, or an advertisement display are included as the EL display. Further, the light-emitting device of the present invention can be used as a display portion of the other various electronic apparatuses.

The following can be given as examples of such electronic apparatuses: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image reproduction device provided with a recording medium (specifically, a device which performs reproduction of a recording medium and is provided with a display which can display those images, such as a digital video disk (DVD)). In particular, because portable information terminals are often viewed from a diagonal direction, the wideness of the field of vision is regarded as very important. Thus, it is preferable that the light-emitting device is employed. Examples of these electronic instruments are shown in FIGS. 16A through 17B.

Figure 16A:
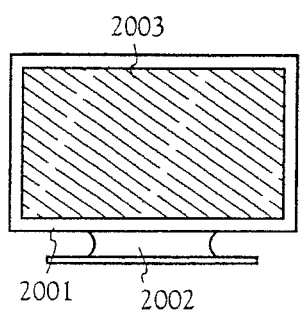
FIGS. 16A to 16F are views of electronic apparatuses each using a light-emitting device of Embodiment 13.

FIG. 16A illustrates an EL display which includes a frame 2001, a support table 2002, a display portion 2003, or the like. The light-emitting device in accordance with the present invention can be used as the display portion 2003. The light-emitting device is of a self-emitting type and therefore requires no back light. Thus, the display portion thereof can have a thickness thinner than that of the liquid crystal display device.

Figure 16B:
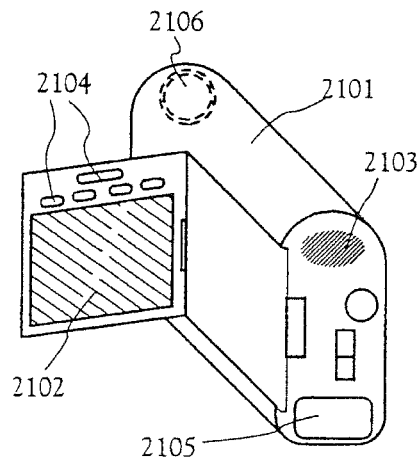

FIG. 16B illustrates a video camera which includes a main body 2101, a display portion 2102, an audio input portion 2103, operation switches 2104, a battery 2105, an image receiving portion 2106, or the like. The light-emitting device in accordance with the present invention can be used as the display portion 2102.

Figure 16C:
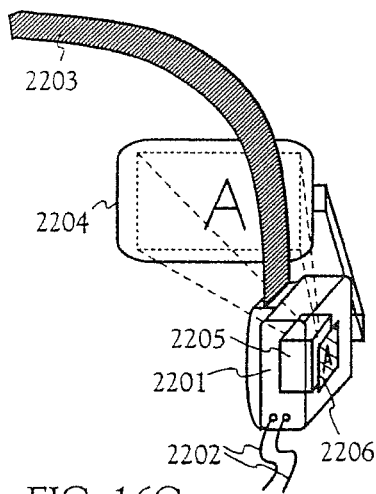

FIG. 16C illustrates a portion (the right-half piece) of an electro-optical device of head-mounted type which includes a main body 2201, signal cables 2202, a head mount band 2203, a screen portion 2204, an optical system 2205, a display portion 2206, or the like. The light-emitting device in accordance with the present invention can be used as the display portion 2206.

Figure 16D:
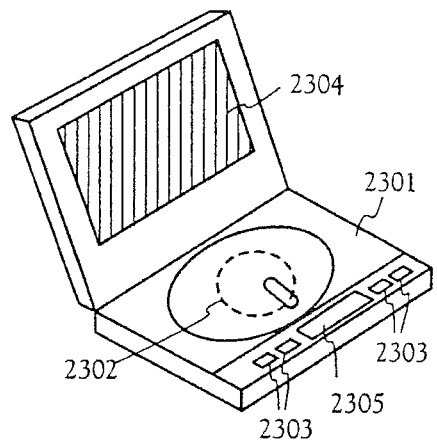

FIG. 16D illustrates an image reproduction apparatus which includes a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) 2304 is used mainly for displaying image information, while the display portion (b) 2305 is used mainly for displaying character information. The light-emitting device in accordance with the present invention can be used as these display portions (a) and (b), 2304 and 2305. The image reproduction apparatus including a recording medium further includes a domestic game equipment or the like.

Figure 16E:
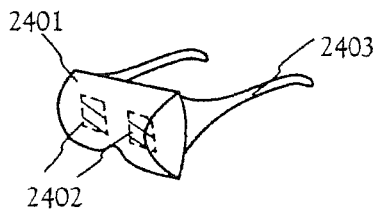

FIG. 16E illustrates a goggle type display (head-mounted display) which includes a main body 2401, a display portion 2402, an arm portion 2403. The light-emitting device in accordance with the present invention can be used as the display portion 2402.

Figure 16F:
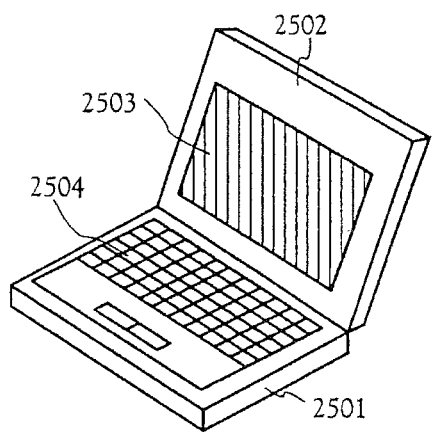

FIG. 16F illustrates a personal computer which includes a main body 2501, a frame 2502, a display portion 2503, a key board 2504, or the like. The light-emitting device in accordance with the present invention can be used as the display portion 2503.

Note that if emission brightness of an EL material becomes higher in the future, it will be applicable to a front-type or rear-type projector in which light including output image information is enlarged by means of lenses or the like to be projected.

The above mentioned electronic apparatuses are more likely to be used for display information distributed through a telecommunication path such as Internet, a CATV (cable television system), and in particular likely to display moving picture information. The light-emitting device is suitable for displaying moving pictures since the EL material can exhibit high response speed.

Further, since a light emitting portion of the light-emitting device consumes power, it is desirable to display information in such a manner that the light emitting portion therein becomes as small as possible. Accordingly, when the light-emitting device is applied to a display portion which mainly displays character information, e.g., a display portion of a portable information terminal, and more particular, a portable telephone or an audio reproducing device, it is desirable to drive the light emitting device so that the character information is formed by a light-emitting portion while a non-emission portion corresponds to the background.

Figure 17A:
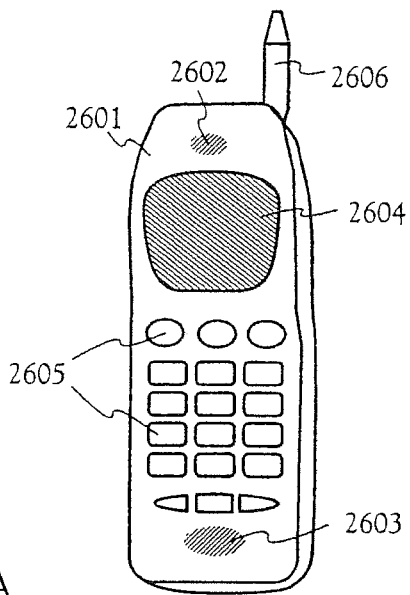
FIGS. 17A and 17B are views of electronic apparatuses each using a light-emitting device of Embodiment 13.

FIG. 17A illustrates a portable telephone which includes a main body 2601, an audio output portion 2602, an audio input portion 2603, a display portion 2604, operation switches 2605, and an antenna 2606. The light-emitting device in accordance with the present invention can be used as the display portion 2604. Note that the display portion 2604 can reduce power consumption of the portable telephone by displaying white-colored characters on a black-colored background.

Figure 17B:
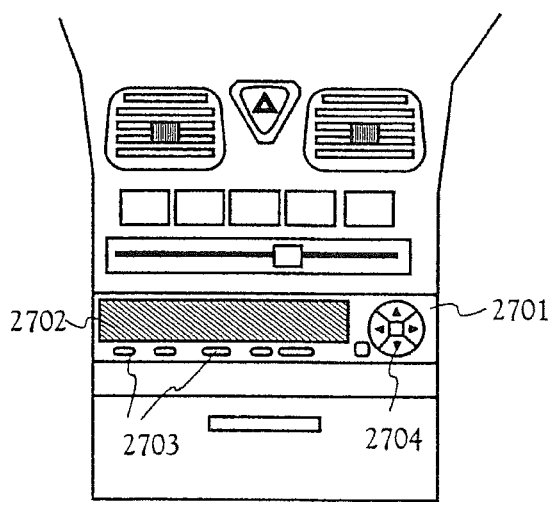
Figure 18:
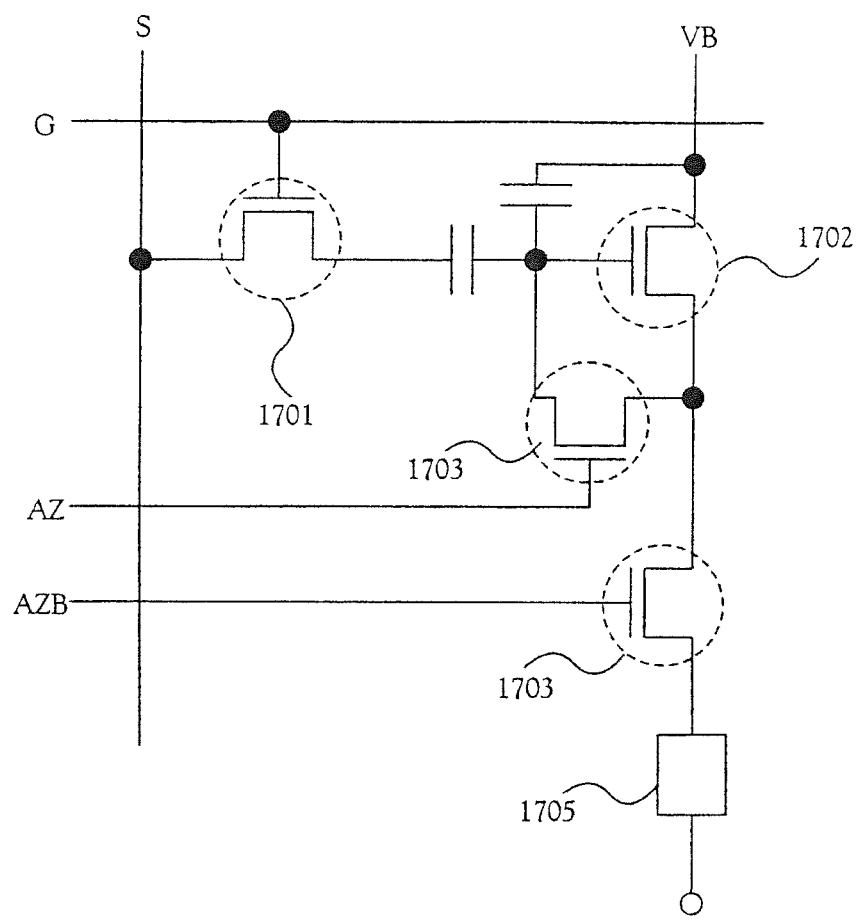
FIG. 18 is a circuit diagram of a pixel portion of a convention light-emitting device.

Further, FIG. 17B illustrates a sound reproduction device, specifically, a car audio equipment in concrete term, which includes a main body 2701, a display portion 2702, and operation switches 2703 and 2704. The light-emitting device in accordance with the present invention can be used as the display portion 2702. Although the car audio equipment of the mount type is shown in the present embodiment, the present invention is also applicable to a portable type or domestic sound reproducing device. The display portion 2702 can reduce power consumption by displaying white-colored characters on a black-colored background, which is particularly advantageous for the portable type sound reproduction device.

As set forth above, the present invention can be applied variously to a wide range of electronic instruments in all fields. The electronic apparatuses in the present embodiment can be obtained by utilizing a light-emitting device having the configuration in which the structures in Embodiments 1 through 12 are freely combined.

According to the present invention, in the case where the fluctuation $\Delta V_{th}$ of the threshold voltage is fixed by a fabricating process of a TFT, from the value of the fluctuation $\Delta V_{th}$ of the threshold voltage, the range of the ratio W/L of the channel width W to the channel length L is determined by the expression 14.

Besides, according to the present invention, in the case where the value of the ratio W/L of the channel width W to the channel length L is fixed by a problem of design, from the value of the ratio W/L of the channel width W to the channel length L, the range of the fluctuation $\Delta V$th of the threshold voltage is determined by the expression 15.

According to the above structure, in the light-emitting device of the present invention, the number of thin film transistors provided in each of the pixels is made two to prevent a drop in the opening ratio, and it becomes possible to suppress uneven luminance due to fluctuation in the threshold voltage of current controlling TFTs included in the respective pixels.

What is claimed is:

1. A semiconductor device comprising:
    a first pixel comprising:
        a first transistor comprising a first semiconductor film including a first channel forming region, the first channel forming region having a first channel width and a first channel length; and
        a first EL element connected to the first transistor; and
    a second pixel comprising:
        a second transistor comprising a second semiconductor film including a second channel forming region, the second channel forming region having a second channel width and a second channel length; and
        a second EL element connected to the second transistor,
    wherein a ratio of the first channel width to the first channel length is different from a ratio of the second channel width to the second channel length,
    wherein the first EL element and the second EL element comprise a first EL material and a second EL material, respectively,
    wherein the first EL material is different from the second EL material, and
    wherein each of the first channel forming region and the second channel forming region comprises crystalline silicon.

2. The semiconductor device according to claim 1, wherein each of the first transistor and the second transistor is a current controlling transistor.

3. The semiconductor device according to claim 1, wherein each of the first transistor and the second transistor is a top-gate transistor.

4. The semiconductor device according to claim 1, wherein emission color of the first pixel is different from that of the second pixel.

5. The semiconductor device according to claim 1, further comprising:
    a first switching transistor having a double gate structure, the first switching transistor being connected to the first transistor; and
    a second switching transistor having a double gate structure, the second switching transistor being connected to the second transistor.

6. The semiconductor device according to claim 1, wherein the ratio of the first channel width to the first channel length is equal to or larger than $2.26 \times 10^{-3}$ and equal to or smaller than 0.214.

7. The semiconductor device according to claim 1, wherein each of the first transistor and the second transistor is a p-channel transistor.

8. The semiconductor device according to claim 1, wherein each of the first transistor and the second transistor includes an LDD region.

9. An electronic apparatus having the semiconductor device according to claim 1, wherein the electronic apparatus is one selected from the group consisting of a video camera, a digital camera, a goggle type display, a car navigation system, an audio reproduction device, a notebook personal computer, a game equipment, a mobile computer, a mobile telephone, a mobile game equipment, an electronic book, and an image reproduction device provided with a recording medium.

10. A semiconductor device comprising:
    a first pixel comprising:
        a first transistor comprising a first semiconductor film including a first channel forming region, the first channel forming region having a first channel width and a first channel length; and
        a first pixel electrode electrically connected to the first transistor;
    a second pixel comprising:
        a second transistor comprising a second semiconductor film including a second channel forming region, the second channel forming region having a second channel width and a second channel length; and
        a second pixel electrode electrically connected to the second transistor;
    a flattening layer interposed between the first channel forming region and the first pixel electrode; and
    a layer including an organic material, the layer being over and in contact with the first pixel electrode,
    wherein a ratio of the first channel width to the first channel length is different from a ratio of the second channel width to the second channel length, and
    wherein each of the first channel forming region and the second channel forming region comprises crystalline silicon.

11. The semiconductor device according to claim 10, wherein each of the first transistor and the second transistor is a current controlling thin film transistor.

12. The semiconductor device according to claim 10, wherein each of the first transistor and the second transistor is a top-gate transistor.

13. The semiconductor device according to claim 10, wherein the first pixel further comprises a first EL element, and
    wherein the second pixel further comprises a second EL element.

14. The semiconductor device according to claim 10, wherein the first pixel further comprises a first switching transistor, and
    wherein the second pixel further comprises a second switching transistor.

15. The semiconductor device according to claim 10, wherein the ratio of the first channel width to the first channel length is equal to or larger than $2.26 \times 10^{-3}$ and equal to or smaller than 0.214.

16. The semiconductor device according to claim 10, wherein each of the first transistor and the second transistor is a p-channel transistor.

17. The semiconductor device according to claim 10, wherein each of the first transistor and the second transistor includes an LDD region.

18. An electronic apparatus having the semiconductor device according to claim 10, wherein the electronic apparatus is one selected from the group consisting of a video camera, a digital camera, a goggle type display, a car navigation system, an audio reproduction device, a notebook personal computer, a game equipment, a mobile computer, a mobile telephone, a mobile game equipment, an electronic book, and an image reproduction device provided with a recording medium.

19. A semiconductor device comprising:
a transistor;
a first interlayer insulating film over the transistor;
a pixel electrode over the first interlayer insulating film and electrically connected to the transistor, wherein part of the pixel electrode is provided in a contact hole provided in the first interlayer insulating film,
an insulating film in contact with the first interlayer insulating film and an edge portion of the pixel electrode, wherein part of the insulating film in the contact hole is in contact with the pixel electrode;
an EL layer over the pixel electrode and the insulating film; and
an electrode overlapping with the pixel electrode with the EL layer interposed therebetween,
wherein a ratio of a channel width to a channel length of the transistor is lower than or equal to 0.214.

20. The semiconductor device according to claim 19, wherein the ratio of the channel width to the channel length is larger than or equal to $2.26 \times 10^{-3}$ and lower than or equal to 0.214.

21. The semiconductor device according to claim 19, wherein the transistor does not comprise an LDD region.

22. The semiconductor device according to claim 19, wherein the transistor comprises crystalline silicon.

23. The semiconductor device according to claim 19, wherein the insulating film comprises an organic resin.

24. The semiconductor device according to claim 19, wherein a gate insulating layer of the transistor comprises:
a first portion overlapping with a gate electrode of the transistor; and
a second portion not overlapping with the gate electrode of the transistor and having a thickness smaller than the first portion.

25. The semiconductor device according to claim 19, comprising a power supply line electrically connected to the pixel electrode through the transistor.

26. The semiconductor device according to claim 25, comprising a capacitor electrically connected to the power supply line.

27. The semiconductor device according to claim 19, comprising a first substrate and a second substrate between which the transistor, the pixel electrode, and the EL layer are positioned.

28. The semiconductor device according to claim 27, wherein the first substrate and the second substrate are each a glass substrate.

29. The semiconductor device according to claim 27, comprising a first sealant between the first substrate and the second substrate.

30. The semiconductor device according to claim 29, comprising a second sealant outer than the first sealant.

31. The semiconductor device according to claim 27, wherein:
the first interlayer insulating film comprises a first region overlapping with the insulating film and a second region not overlapping with the insulating film;
the EL layer do not overlap with either the first region or the second region; and
the first region and the second region are located at a periphery of the first substrate.

32. The semiconductor device according to claim 19, wherein the transistor is a current controlling transistor.

33. The semiconductor device according to claim 19, wherein the pixel electrode comprises indium.

34. The semiconductor device according to claim 19, wherein the transistor is a top-gate transistor.

35. An electronic apparatus having the semiconductor device according to claim 19, wherein the electronic apparatus is one selected from the group consisting of a video camera, a digital camera, a goggle type display, a car navigation system, an audio reproduction device, a notebook personal computer, a gate equipment, a mobile computer, a mobile telephone, a mobile gate equipment, an electronic book, and an image reproducing device provided with a recording medium.

36. A semiconductor device comprising:
a first pixel and a second pixel each comprising:
a first transistor; and
an EL element comprising:
a pixel electrode electrically connected to the first transistor;
an EL layer over the pixel electrode; and
an electrode overlapping with the pixel electrode with the EL layer interposed therebetween,
wherein a ratio of a channel width to a channel length of the first transistor in the first pixel is different from a ratio of a channel width to a channel length of the first transistor in the second pixel.

37. The semiconductor device according to claim 36, wherein the EL layer in the first pixel comprises a first EL material and the EL layer in the second pixel comprises a second EL material different from the first EL material.

38. The semiconductor device according to claim 36, wherein the channel length is larger than the channel width.

39. The semiconductor device according to claim 36, wherein the ratio of the channel width to the channel length is lower than or equal to 0.214.

40. The semiconductor device according to claim 36, wherein the ratio of the channel width to the channel length is larger than or equal to $2.26 \times 10^{-3}$ and lower than or equal to 0.214.

41. The semiconductor device according to claim 36, wherein the first transistor does not comprise an LDD region.

42. The semiconductor device according to claim 36, the wherein the first transistor comprises crystalline silicon.

43. The semiconductor device according to claim 36, wherein a gate insulating layer of the first transistor comprises:
a first portion overlapping with a gate electrode of the first transistor; and
a second portion not overlapping with the gate electrode of the first transistor and having a thickness smaller than the first portion.

44. The semiconductor device according to claim 36, comprising a power supply line electrically connected to the pixel electrode through the first transistor.

45. The semiconductor device according to claim 44, comprising a capacitor electrically connected to the power supply line.

46. The semiconductor device according to claim 36, comprising a first substrate and a second substrate between which the first pixel and the second pixel are positioned.

47. The semiconductor device according to claim 46, wherein the first substrate and the second substrate are each a glass substrate.

48. The semiconductor device according to claim 46, comprising a first sealant between the first substrate and the second substrate.

49. The semiconductor device according to claim 48, comprising a second sealant outer than the first sealant.

50. The semiconductor device according to claim 36, wherein the first transistor is a current controlling transistor.

51. The semiconductor device according to claim 36, wherein the pixel electrode comprises indium.

52. The semiconductor device according to claim 36, wherein the first transistor is a top-gate transistor.

53. An electronic apparatus having the semiconductor device according to claim 36, wherein the electronic apparatus is one selected from the group consisting of a video camera, a digital camera, a goggle type display, a car navigation system, an audio reproduction device, a notebook personal computer, a gate equipment, a mobile computer, a mobile telephone, a mobile gate equipment, an electronic book, and an image reproducing device provided with a recording medium.

\* \* \* \* \*